United States Patent
Tsukamoto et al.

(10) Patent No.: US 9,279,863 B2
(45) Date of Patent: Mar. 8, 2016

(54) HIGH-TEMPERATURE SUPERCONDUCTING MAGNETIC SENSOR

(75) Inventors: Akira Tsukamoto, Kawasaki (JP); Seiji Adachi, Kawasaki (JP); Yasuo Oshikubo, Kawasaki (JP); Keiichi Tanabe, Kawasaki (JP)

(73) Assignee: International Superconductivity Technology Center, Kanagawa (JP)

( * ) Notice: Subject to any disclaimer, the term of this patent is extended or adjusted under 35 U.S.C. 154(b) by 104 days.

(21) Appl. No.: 14/367,287

(22) PCT Filed: Sep. 10, 2012

(86) PCT No.: PCT/JP2012/073020
§ 371 (c)(1),
(2), (4) Date: Jun. 20, 2014

(87) PCT Pub. No.: WO2013/094253
PCT Pub. Date: Jun. 27, 2013

(65) Prior Publication Data
US 2015/0219730 A1    Aug. 6, 2015

(30) Foreign Application Priority Data
Dec. 21, 2011  (JP) ................... 2011-280040

(51) Int. Cl.
*G01R 33/00* (2006.01)
*H01L 39/00* (2006.01)
(Continued)

(52) U.S. Cl.
CPC .......... *G01R 33/0354* (2013.01); *G01R 33/035* (2013.01); *H01L 39/025* (2013.01); *H01L 39/22* (2013.01); *H01L 39/225* (2013.01)

(58) Field of Classification Search
CPC ............ G01R 33/035–33/0354; H01L 39/025; H01L 39/22; H01L 39/225
See application file for complete search history.

(56) References Cited

U.S. PATENT DOCUMENTS

| 6,603,308 B2* | 8/2003 | Itozaki | ............... | G01R 33/0358 324/248 |
| 7,705,590 B2* | 4/2010 | Meyer | ................ | G01R 33/0358 324/248 |

(Continued)

FOREIGN PATENT DOCUMENTS

| JP | 2001-091611 A | 4/2001 |
| JP | 2001-153936 A | 6/2001 |

OTHER PUBLICATIONS

J. M. Jaycox and M. B. Ketchen, "Planar Coupling Scheme for Ultra Low Noise DC SQUIDS," IEEE Trans Magn., vol. MAG-17, No. 1, Jan. 1981, pp. 400-403.

(Continued)

*Primary Examiner* — Colleen Dunn
(74) *Attorney, Agent, or Firm* — Capitol City TechLaw, PLLC; Samuel P. Burkholder

(57) ABSTRACT

A high-temperature superconducting magnetic sensor having superconducting layers formed on a substrate, a superconducting quantum interference device (SQUID) being formed on the superconducting layers, the high-temperature superconducting magnetic sensor includes: a pickup coil that is formed on the superconducting layer and is connected to an inductor of the SQUID; and an input coil that is formed on the superconducting layer, is connected to the inductor of the SQUID and the pickup coil to form a closed loop, and is magnetically coupled with the inductor of the SQUID. In planar view, at least one turn of the input coil surrounds the inductor of the SQUID, or is surrounded by the inductor of the SQUID. The width of the superconductor forming the inductor of the SQUID is 10 μm or less.

7 Claims, 13 Drawing Sheets

(51) Int. Cl.
  *G01R 33/035* (2006.01)
  *H01L 39/22* (2006.01)
  *H01L 39/02* (2006.01)

(56) References Cited

U.S. PATENT DOCUMENTS

| | | | | |
|---|---|---|---|---|
| 8,548,542 | B2* | 10/2013 | Hatsukade | G01R 33/035 505/162 |
| 8,723,514 | B2* | 5/2014 | Finkler | B82Y 35/00 324/248 |
| 8,933,695 | B1* | 1/2015 | Kornev | G01R 33/0354 324/225 |

OTHER PUBLICATIONS

Drung D, Ludwig F, Muller W, Steinhoff U, Trahms L, Koch H, Shen Y Q, Jensen M B, Vase P, Holst T, Freltoft T, and Curio G, "Integrated YBa2Cu3O7-x magnetometer for biomagnetic measurements," Appl. Phys. Lett. 68, Mar. 1996, pp. 1421-1423, American Institute of Physics.

Faley M I, Poppe U, Urban K, D N Paulson, and R L Fagaly, "A New Generation of the HTS Multilayer DC-SQUID Magnetometers and Gradiometers," Journal of Physics: Conference Series 43, 2006, pp. 1199-1202, IOP Publishing Ltd.

Adachi S, Tsukamoto A, Oshikubo Y, Hato T, Ishimaru Y, and Tanabe K, "Fabrication of Low-Noise HTS-SQUID Gradiometers and Magnetometers With Ramp-Edge Josephson Junctions," IEEE Trans. Appl. Supercond, vol. 21, No. 3, Jun. 2011, pp. 367-370.

E. Dantsker, and S. Tanaka, J. Clarke, "High-Tc super conducting quantum interference devices with slots or holes: Low 1/f noise in ambient magnetic fields," Appl. Phys. Lett., vol. 70, No. 15, Apr. 1997, pp. 2037-2039, American Institute of Physics.

K. Enpuku, K. Sueoka, K. Yoshida, and F. Irie, "Effect of damping resistance on voltage versus flux relation of a dc SQUID with large inductance and critical current,"J. Appl. Phys., vol. 57, No. 5, Mar. 1985, pp. 1691-1697.

Tsukamoto A, Saitoh K, Yokosawa K, Suzuki D, Seki Y, Kandori A, and Tsukada K, "Development of high-throughput fabrication process of HTS SQUID for 51-ch MCG system," Physica C 426-431, Jul. 2005, pp. 1580-1584, Elsevier B.V.

J. Clarke, et al., Chapter 1 Introduction, "The SQUID Handbook, vol. I: Fundamentals and Technology of SQUIDs and SQUID Systems," 2004, ISBN: 978-3-527-40229-8, pp. 6-13, Wiley-VCH, Weinheim, Germany.

International Search Report of PCT/JP2012/073020 mailed Dec. 11, 2012 by Japanese Patent Office.

* cited by examiner

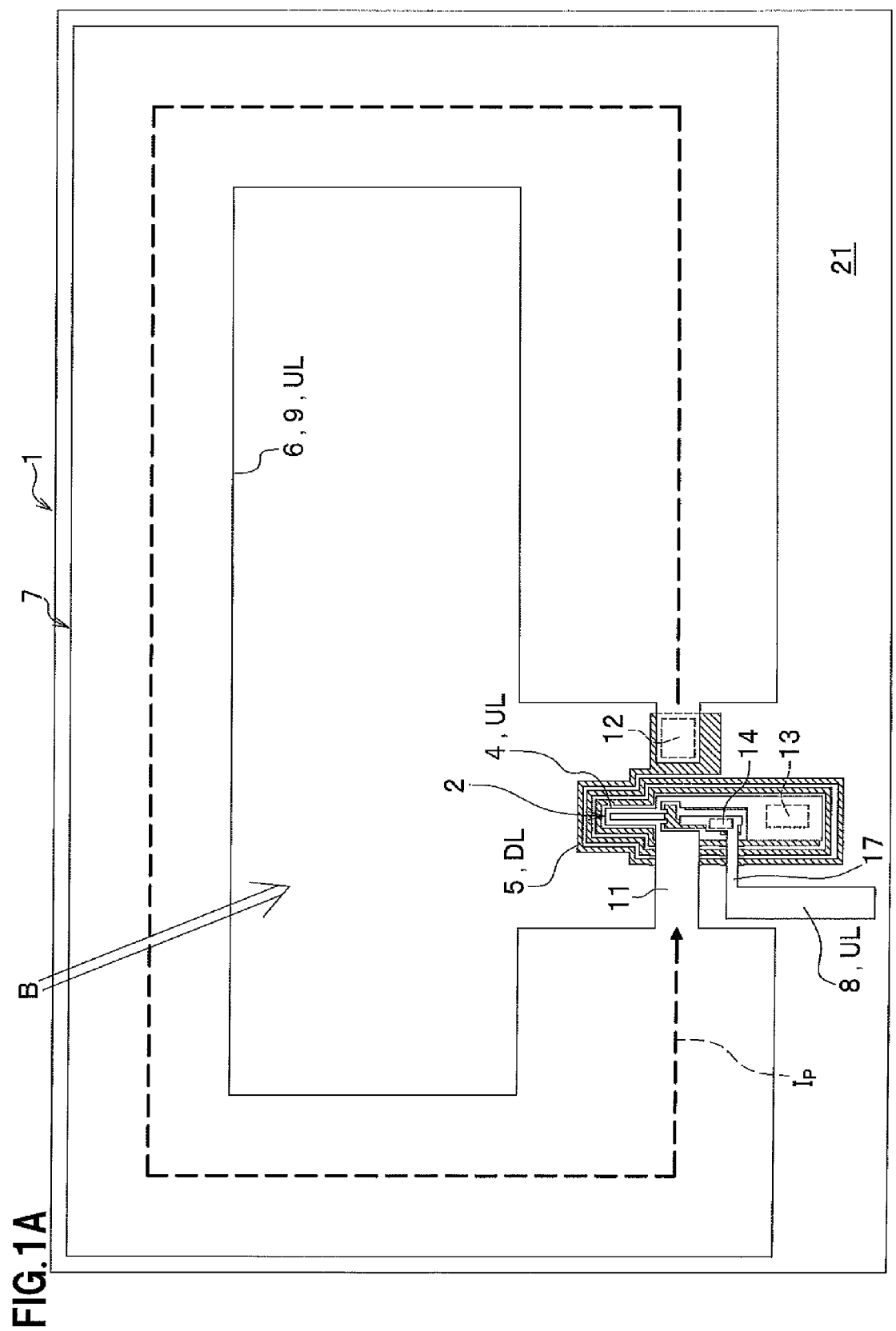

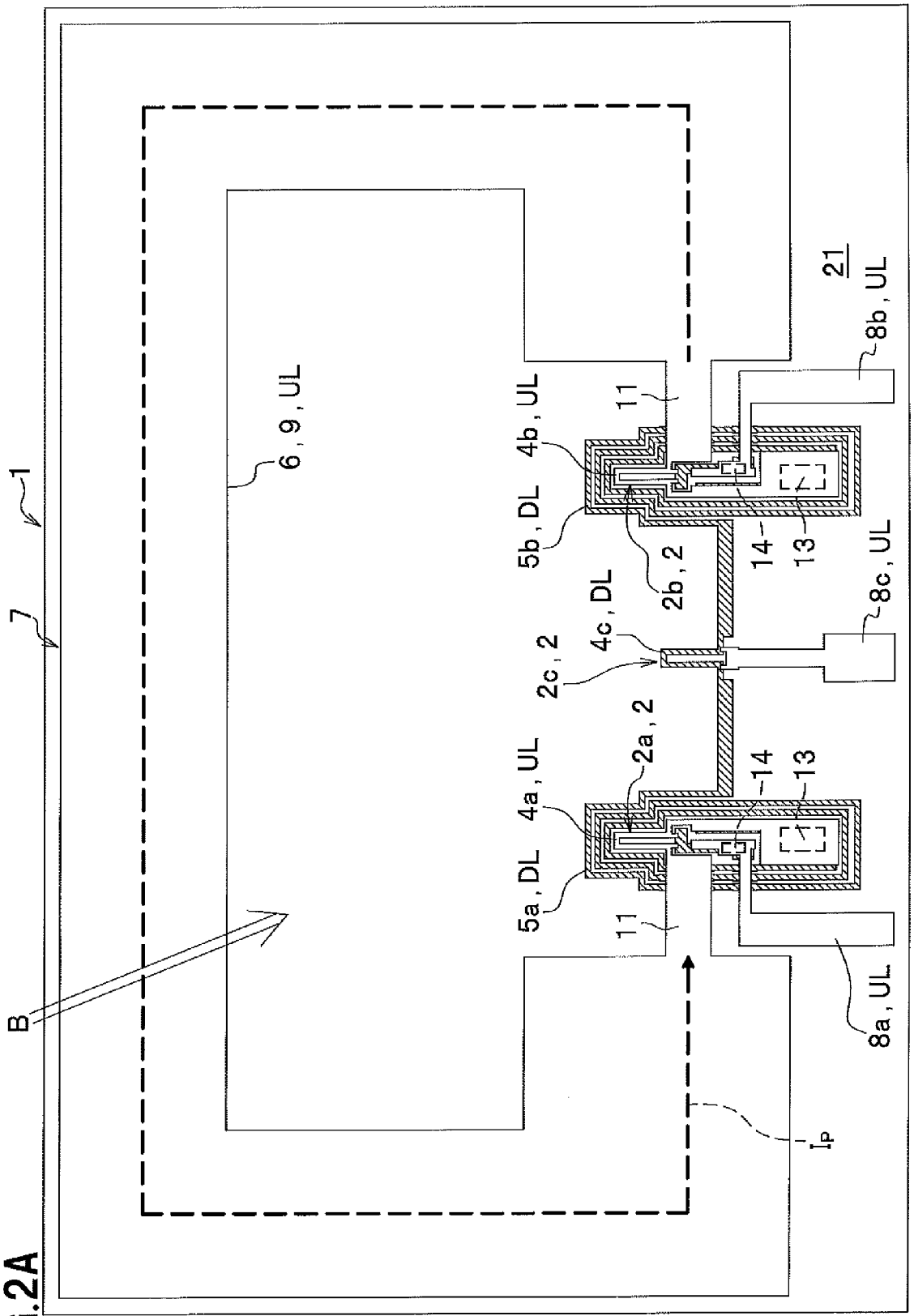

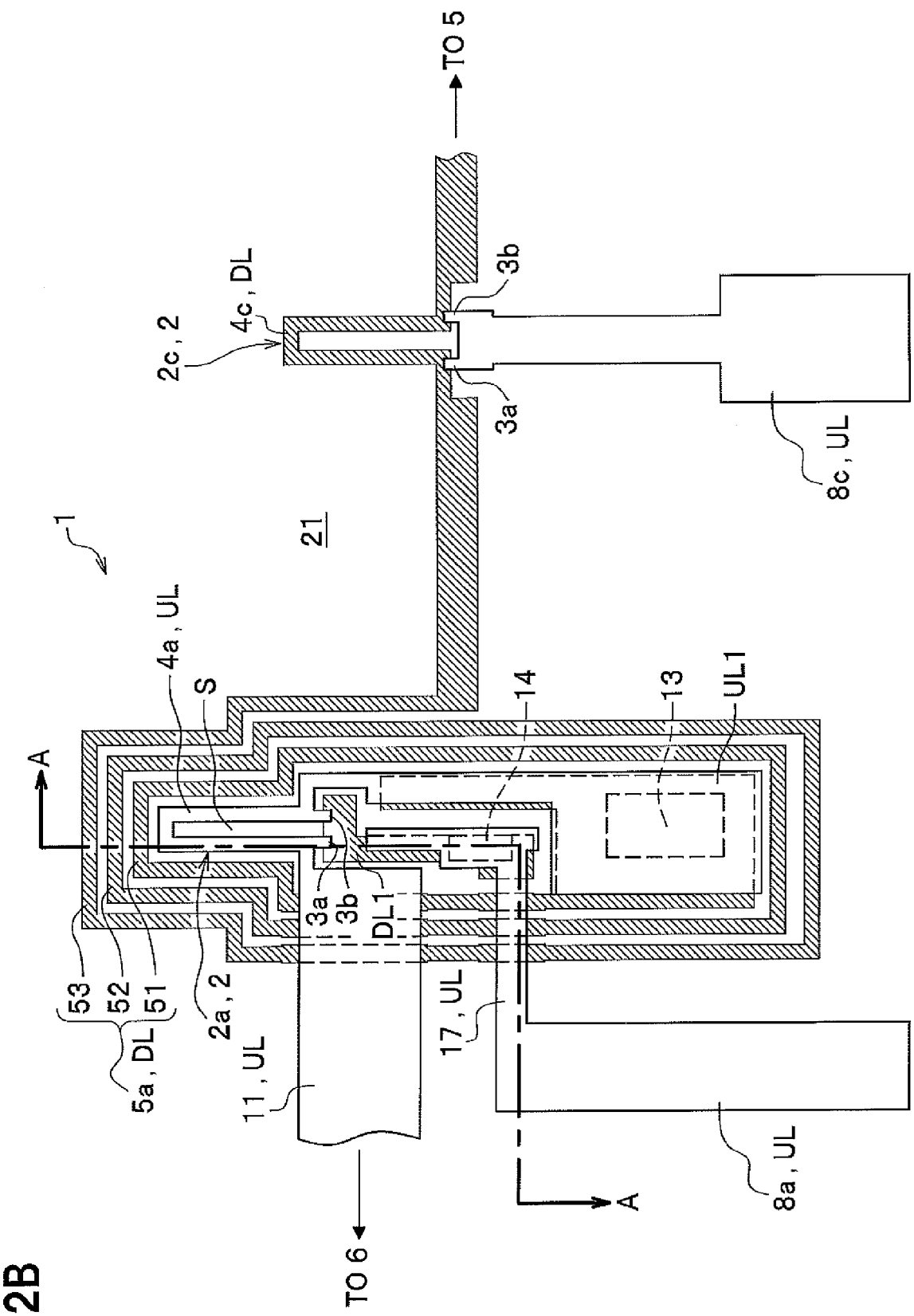

HIGH-TEMPERATURE SUPERCONDUCTING MAGNETIC SENSOR

TECHNICAL FIELD

The present invention relates to a high-temperature superconducting magnetic sensor having a Superconducting Quantum Interference Device (SQUID).

BACKGROUND ART

A SQUID is known as a magnetic sensor that can detect a magnetic signal with the highest sensitivity, and has been used in measurement of a feeble biomagnetic signal generated from the brain, the heart or the like, non-destructive inspection using residual magnetism or eddy current detection, and recently in a very low magnetic field MRI (magnetic resonance imaging) or the like. However, a SQUID of a low-temperature superconductor that needs liquid helium for cooling which is expensive and hard to treat has been limited in the range of application of the SQUID. Since discovery of a high-temperature superconductor that exhibits superconducting characteristics at the temperature of liquid nitrogen, the development of a SQUID of a high-temperature superconductor that operates at the temperature of liquid nitrogen has been energetically advanced. A high-temperature superconducting magnetic sensor having a detection sensitivity of 100 fT/Hz$^{1/2}$ or less is presently available for purchase, and a high-temperature superconducting magnetic sensor having a detection sensitivity of 10 fT/Hz$^{1/2}$ or less has been reported in the leading edge of research and development. A high-temperature superconducting magnetic sensor (SQUID of a high-temperature superconductor) enables cooling using liquid nitrogen which is low in cost and easy to treat, and thus various structures have been proposed (see Non-Patent Literatures 1 to 8). The SQUID of a high-temperature superconductor enables the cooling using liquid nitrogen which is low in cost and easy to treat, and new applications such as non-destructive inspection have been proposed.

CITATION LIST

Non Patent Literature

Non-Patent Literature 1: Chapter 1 Introduction, "The SQUID Handbook: Fundamentals and Technology of SQUIDs and SQUID Systems, Volume I", Edited by John Clarke, Alex I. Braginski, ISBN: 978-3-527-40229-8

Non-Patent Literature 2: J. M. Jaycox and M. B. Ketchen, IEEE Trans Magn. MAG-17, (1981) 400-403

Non-Patent Literature 3: Drung D, Ludwig F, Muller W, Steinhoff U, Trahms L, Koch H, Shen Y Q, Jensen M B, Vase P, Holst T, Freltoft T, and Curio G, Appl. Phys. Lett, 68 (1996) 1421

Non-Patent Literature 4: Faley M I, Poppe U, Urban K, D N Paulson, and R L Fagaly, Journal of Physics: Conference Series 43 (2006) 1199-1202

Non-Patent Literature 5: Adachi S, Tsukamoto A, Oshikubo Y, Hato T, Ishimaru Y, and Tanabe K, IEEE Trans. Appl. Supercond, 21 (2011) 367-70

Non-Patent Literature 6: E. Dantsker, and S. Tanaka, J. Clarke, Appl. Phys. Lett. Vol. 70 No. 15 (1997) 2037-2039

Non-Patent Literature 7: K. Enpuku, K. Sueoka, K. Yoshida, and F. Irie, J. Appl. Phys, 57 (1985) 1691

Non-Patent Literature 8: Tsukamoto A, Saitoh K, Yokosawa K, Suzuki D, Seki Y, Kandori A, and Tsukada K, Physica C 426-431 (2005) 1580-84

SUMMARY OF INVENTION

Technical Problem

SQUIDs include an RF-SQUID that includes one Josephson junction in its superconducting closed loop, and a DC-SQUID that includes two Josephson junctions in its superconducting closed loop. Non-Patent Literature 1 proposes a basic structure of the DC-SQUID, and Non-Patent Literatures 2 to 8 also refer to the DC-SQUID. The DC-SQUID constitutes a closed loop structure (superconducting closed loop) by a SQUID inductor and two Josephson junctions. When making a bias current $I_b$, which is slightly larger than a critical current $I_c$, flow between terminals of the SQUID and generating a voltage V in the two Josephson junctions, the voltage V generated across the terminals varies periodically with flux quantum $\Phi_0 (=2.07 \times 10^{-15}$ Wb) as a cycle by magnetic flux $\Phi$ interlinking the closed loop structure. Feedback control using a flux locked loop circuit (FLL circuit) makes it possible to measure a slight variation of flux such as $1/10^5$ to $1/10^6$, of the flux quantum $\Phi_0$.

A SQUID uses a pickup coil of a larger size when it is used as a highly-sensitive magnetic sensor, because its width is generally no more than tens of to hundreds of micrometers of size. The pickup coil together with an input coil constitutes a magnetic flux transformer (closed loop structure) and uses the input coil with magnetically coupled with the SQUID. When a magnetic field B is applied to the pickup coil, a magnetic flux interlinking the pickup coil changes. A shielding current $I_p$ proportional to a change of the interlinking magnetic flux flows through the pickup coil. The shielding current $I_p$ flows through the input coil in the closed loop structure, and a magnetic flux proportional to the shielding current $I_p$ is generated in the SQUID magnetically coupled with the input coil. Namely, a variation of the magnetic flux which is generated by a variation of the magnetic field B and interlinks the pickup coil is transmitted from the pickup coil to the SQUID. Assuming that an inductance of the SQUID inductor is $L_s$, an area of the pickup coil is $A_p$, an inductance of the pickup coil is $L_p$, an inductance of the input coil is $L_i$, and a mutual inductance between the SQUID and the input coil is M, and influence by an inductance of wiring portions between the input coil and the pickup coil is ignored, a magnetic flux $\Phi_s$ detected by the SQUID (high-temperature superconducting magnetic sensor) when the external magnetic field B is applied to the pickup coil has the relation of formula (1).

$$\Phi_s = I_p \cdot M \qquad (1)$$
$$= BA_p \cdot M / (L_p + L_i)$$
$$= BA_p \cdot k(L_i \cdot L_s)^{1/2} / (L_p + L_i)$$

Here, the mutual inductance M has the relation of formula $M = k(L_i \cdot L_s)^{1/2}$, where k is a coupling coefficient (0<k<1). A ratio ($\Phi_s/B$) of the magnetic flux $\Phi_s$ detected by the SQUID to the external magnetic field B is called an effective area $A_{\it eff}$ and has the relation of formula (2).

$$A_{\it eff} = \Phi_s / B \qquad (2)$$
$$= A_p \cdot M / (L_p + L_i)$$
$$= A_p \cdot k(L_i \cdot L_s)^{1/2}(L_p + L_i)$$

From the formula (2), conditions under which the effective area $A_{eff}$ increases, i.e., conditions under which a detection efficiency of the high-temperature superconducting magnetic sensor is heightened are examined. The inductance $L_s$ of the SQUID inductor is generally set to a magnitude of 40 to 100 pH because a modulation voltage amplitude $\Delta V$ of the SQUID becomes small to increase flux noise when the magnitude is too much. Moreover, since the pickup coil has a size and a shape depending on its use, the area $A_p$ and the inductance $L_p$ of the pickup coil are values which are separately determined. Therefore, adjustable parameters for maximizing the effective area $A_{eff}$ in the formula (2) are the coupling coefficient k and the inductance $L_i$ of the input coil. When magnetic coupling between the input coil and the SQUID is perfect, the coupling coefficient k becomes 1 of the maximum value and the effective area $A_{eff}$ also becomes the maximum. Moreover, from the formula (2), when the inductance $L_i$ of the input coil is equal to the inductance $L_p$ of the pickup coil ($L_i = L_p$), the effective area $A_{eff}$ becomes the maximum ($A_{eff} = A_p (L_s/L_i)^{1/2}/2$).

Non-Patent Literature 2 proposes a Ketchen-type SQUID which is an ideal structure. The Ketchen-type SQUID has a structure in which an input coil of a multi-turn structure is stacked via a thin insulator layer on a washer-type SQUID inductor, and a value close to 1 is obtained as the coupling coefficient k. Moreover, the number of turns of the multi-turn structure of the input coil is designed so that the inductance $L_p$ of the pickup coil and the inductance $L_i$ of the input coil become equal ($L_i = L_p$). By this configuration, the effective area $A_{eff}$ is approximated to the theoretical maximum value. Note that the Ketchen-type SQUID is also called an integrated type SQUID.

As for a low-temperature superconducting SQUID (LTS-SQUID) using niobium (Nb) as superconductor, the Ketchen-type SQUID is generally used. On the other hand, as for a high-temperature superconductor SQUID (HTS-SQUID), a directly-coupled type SQUID whose manufacturing process is simple has been the mainstream, as stated later. It is because a formation technique of multi-layer thin films including a plurality of superconductor layers is needed to manufacture an integrated type SQUID, but as for a high-temperature superconductor, a technique of easily forming a reliable multi-layer thin film has not yet been established. However, some research institutes including a research institute to which the inventors belong have reported a high-temperature superconducting magnetic sensor which adopts an integrated type SQUID and has a detection sensitivity of 10 $fT/Hz^{1/2}$ or less (see Non-Patent Literature 3 (Drung), Non-Patent Literature 4 (Faley), Non-Patent Literature 5 (Adachi)).

Thus, a high-temperature superconducting magnetic sensor of an integrated type SQUID is expected to have a high sensitivity. However, it is known that, when the sensor is cooled in a magnetic field such as in a geomagnetic field, a phenomenon called magnetic flux trapping occurs to generate noises. It is required in the high-temperature superconducting magnetic sensor that the SQUID operates even in a shieldless environment without magnetic shielding. When an integrated type SQUID is cooled in the geomagnetic field (shieldless environment), magnetic flux is trapped in the superconductor constituting the SQUID when cooling (magnetic flux trapping). The magnetic flux trapped at one site in the superconductor is moved to another site by thermal energy or a change of an external magnetic field in some cases, and movement of the magnetic flux is transferred as a change of the magnetic field to the SQUID to thereby cause noises. Specifically, when magnetic flux is trapped in the superconductor of the SQUID inductor, a change of the magnetic flux is directly transferred to the SQUID to thereby cause greater noises and make the original high sensitivity unable to be maintained. Such magnetic flux trapping occurs not only when cooling in the magnetic field, but also when applying a strong magnetic field or a magnetic field accompanying an abrupt change of the magnetic field.

When a superconducting thin film having a width w is cooled in a magnetic field in the direction perpendicular to the thin film, the maximum magnetic field (threshold magnetic field) $B_{th}$ in which the superconductor can push out the flux of the magnetic field outward is predicted from the Clem's formula expressed by formula (3) (Non-Patent Literature 6).

$$B_{th} = \pi \Phi_0 / 4w^2 \qquad (3)$$

This formula (3) indicates that in the case of the geomagnetic field being 50 μT for example, the superconducting thin film can push out the flux outward when the width w of the superconducting thin film is 5.7 μm or less, but magnetic flux trapping occurs when the width w exceeds 5.7 μm. In an integrated type SQUID, an input coil of a multi-turn structure is stacked on a SQUID inductor, and accordingly, the SQUID inductor becomes a wide washer-type and its width becomes wide to the extent of hundreds of micrometers. For this reason, magnetic flux trapping readily occurs in the SQUID inductor of the integrated type SQUID.

To cope with this, Non-Patent Literature 6 proposes forming a washer-type SQUID inductor of a high-temperature superconductor as a mesh structure having a line width of 4 μm, or a slit structure having a line width of 4 μm. It is reported that the above configuration can prevent magnetic flux trapping from occurring in the washer-type SQUID inductor. However, since the surface of the washer-type SQUID inductor of a mesh structure or a slit structure is not flat but of a concavo-convex shape, it is technically difficult to form a multi-turn input coil on the concavo-convex shape, and to date, a Ketchen-type SQUID of such structure has not been reported. The Ketchen-type SQUID can obtain a large coupling coefficient k close to 1 and is highly sensitive, but in the application requiring cooling in the geomagnetic field, magnetic flux trapping readily occurs and it is difficult to suppress the magnetic flux trapping. Moreover, since the input coil of the multi-turn structure is stacked on the washer-type SQUID inductor, a large capacitive component is generated between the input coil and the SQUID inductor. Consequently, a problem occurs in that LC resonance is generated to deteriorate the characteristics of the SQUID (see Non-Patent Literature 7). An approach such as providing a damping resistor is known, but it has hardly ever been tried especially in a magnetic sensor of a high-temperature superconductor for which manufacturing technology has not yet been established, because manufacturing steps are complicated.

In general, in a magnetic sensor of a low-temperature superconductor, a pickup coil is formed with a wire of superconductor such as niobium (Nb) and is superconducting connected to an input coil fabricated together with a SQUID on a substrate. Accordingly, by magnetically shielding the substrate, it is possible to shield the SQUID without shielding the pickup coil. Even when applying a strong magnetic field or a magnetic field accompanying an abrupt change of the magnetic field, magnetic flux trapping does not occur because the magnetic field is not applied to the SQUID in itself. However, in a high-temperature superconducting magnetic sensor, a SQUID and a pickup coil are fabricated on the same substrate so as to omit superconducting connection because superconducting connection technology for a high-temperature superconductor has not yet been established. It is difficult to magnetically shield only the SQUID without magnetically shielding the pickup coil on the same substrate.

As a SQUID of a different structure from that of Ketchen type, proposed is a directly-coupled type SQUID in which a pickup coil and a SQUID inductor are connected in series (Non-Patent Literature 8). In the directly-coupled type SQUID, it is possible to make SQUIDs with a superconductor thin film of one layer. A Josephson junction uses a grain boundary junction such as a bicrystal junction or a step-edge junction, which can be formed with a superconductor thin film of single layer. In the directly-coupled type SQUID, a pickup coil is directly connected to a slit hole type SQUID inductor, and the SQUID inductor doubles as an input coil which is omitted. More specifically, a shielding current $I_p$ which is induced by a magnetic flux interlinking the pickup coil flows directly through the SQUID inductor. The directly-coupled type SQUID has a current coupling structure in which the input coil through which the shielding current $I_p$ flows is not magnetically coupled with the SQUID inductor of the SQUID, but the shielding current $I_p$ flows directly through the SQUID inductor. The directly-coupled type SQUID can be made using a superconductor thin film of one layer, with no need to laminate an input coil on the SQUID inductor. For this reason, the directly-coupled type SQUID has been the mainstream with respect to a high-temperature superconductor for which a technique of easily forming a reliable multi-layer thin film has not yet been established. Moreover, since the directly-coupled type SQUID has no need to laminate an input coil on the SQUID inductor, it is possible to narrow a line width of the SQUID inductor, and also to suppress occurrence of magnetic flux trapping by making the SQUID inductor with a width of 5 μm or less even if the SQUID is cooled in the geomagnetic field.

However, the directly-coupled type SQUID is inferior to the integrated type SQUID in terms of sensitivity. As for the directly-coupled type SQUID, since the SQUID inductor doubles as the input coil, the inductance $L_i$ of the input coil is equal to the inductance $L_s$ of the SQUID inductor ($L_i=L_s$), and is around 40 to 100 pH. Since the inductance $L_p$ of the pickup coil is a value of several nanohenries to tens of nanohenries, it has a poor matching with the inductance $L_s$ of the SQUID inductor ($L_p \gg L_s$). The effective area $A_{eff}$ in this case can be approximated as in formula (4), in consideration of $L_p \gg L_s$. In this case, the effective area $A_{eff}$ (coupling coefficient between the pickup coil and the SQUID) becomes smaller than the effective area $A_{eff}(=A_p(L_s/L_i)^{1/2}/2)$ in Non-Patent Literature 2. In general, the effective area $A_{eff}$ of the directly-coupled type SQUID is one-fifth to one-tenth of that of the integrated type SQUID.

$$A_{eff}=A_p \cdot L_s/L_p \quad (4)$$

As described above, as for the Ketchen type SQUID, it is highly sensitive, but magnetic flux trapping readily occurs, and as for the directly-coupled type SQUID, its sensitivity is low, but magnetic flux trapping does not readily occur.

It is therefore an object of the present invention to provide a high-temperature superconducting magnetic sensor which has high sensitivity and in which magnetic flux trapping does not readily occur.

Solution to Problem

In order to solve the above problems, the present invention provides a high-temperature superconducting magnetic sensor having superconducting layers formed on a substrate, a superconducting quantum interference device (SQUID) being formed on the superconducting layers, the high-temperature superconducting magnetic sensor including: a pickup coil that is formed on the superconducting layers and connected to an inductor of the SQUID; and an input coil that is formed on the superconducting layers, connected to the inductor of the SQUID and the pickup coil to form a closed loop, and magnetically coupled with the inductor of the SQUID, wherein at least one turn of the input coil surrounds the inductor of the SQUID, or is surrounded by the inductor of the SQUID, in planar view.

Advantageous Effects of Invention

According to the present invention, it is possible to provide a high-temperature superconducting magnetic sensor in which magnetic flux trapping does not readily occur.

BRIEF DESCRIPTION OF DRAWINGS

FIG. 1A is a plan view of a high-temperature superconducting magnetic sensor according to a first embodiment of the present invention.

FIG. 2A is a plan view of a high-temperature superconducting magnetic sensor according to a second embodiment of the present invention.

FIG. 2B is an enlarged view of the circumference of SQUIDs 2a, 2c in FIG. 2A.

FIGS. 3A to 3D are cross-sectional views in process of manufacture of the high-temperature superconducting magnetic sensor according to the second embodiment of the present invention, in which FIG. 3A is a cross-sectional view at a first step in the process, FIG. 3B is a cross-sectional view at a second step in the process, FIG. 3C is a cross-sectional view at a third step in the process, and FIG. 3D is a cross-sectional view at a fourth step in the process.

DESCRIPTION OF EMBODIMENTS

Figure 1B:
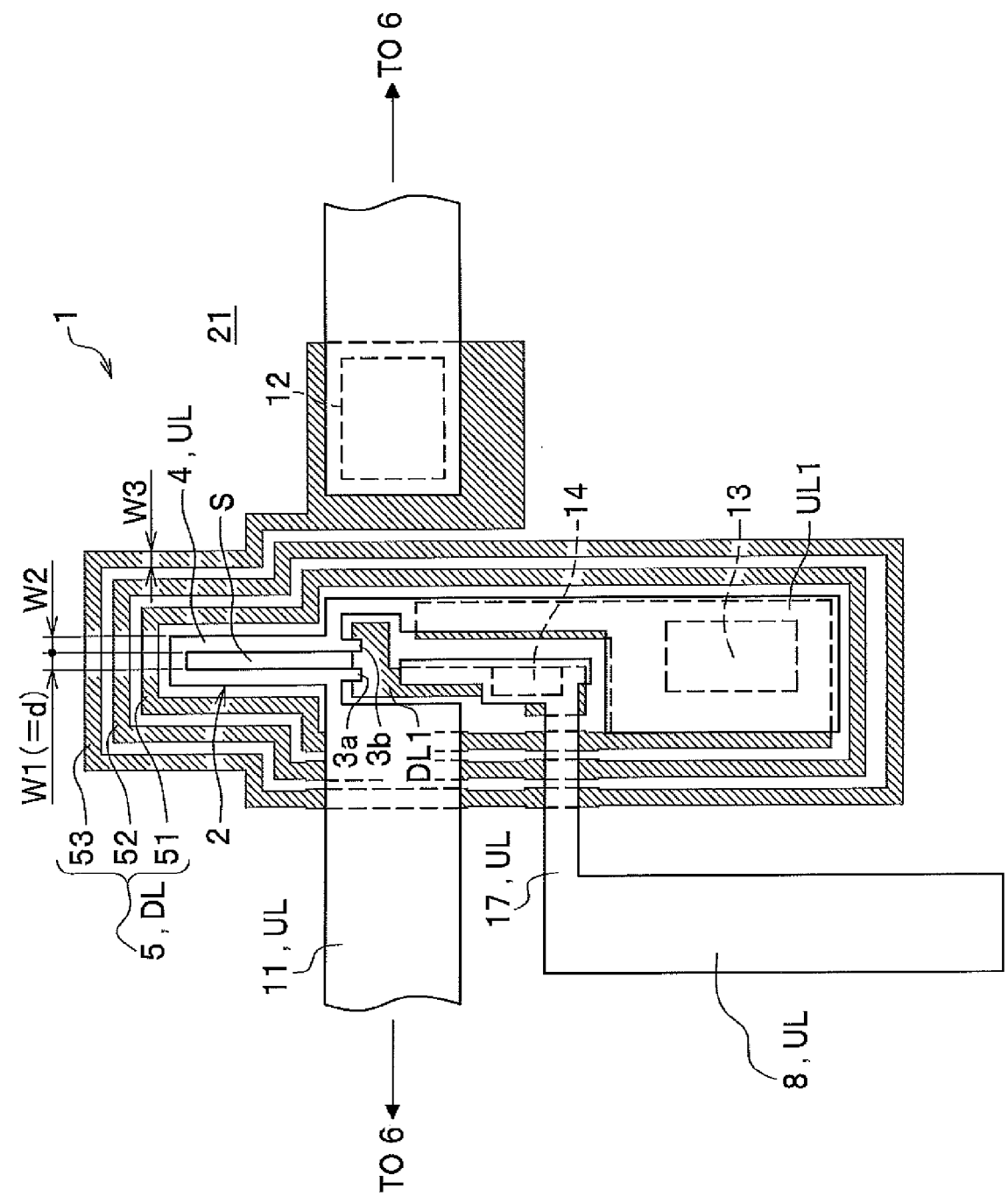
FIG. 1B is an enlarged view of the circumference of a superconducting quantum interference device (SQUID) 2 in FIG. 1A.

Hereinafter, embodiments for carrying out the present invention will be described in detail with reference to the drawings.

(First embodiment)

FIG. 1A illustrates a plan view of a high-temperature superconducting magnetic sensor 1 according to a first embodiment of the present invention. The high-temperature superconducting magnetic sensor 1 includes a substrate 21, and two-layered superconducting layers formed on the substrate 21, which are a lower part superconducting layer (first superconducting layer) DL and an upper part superconducting layer (second superconducting layer) UL. In FIG. 1A, the lower part superconducting layer DL is indicated by diagonal hatched portions, A superconducting quantum interference device (SQUID) 2, an input coil 5, a pickup coil 6 and an electrode 8 are formed on the lower part superconducting layer DL and the upper part superconducting layer UL. The input coil 5 is formed on the lower part superconducting layer DL, and a SQUID inductor 4 which is part of the SQUID 2, the pickup coil 6 and the electrode 8 are formed on the upper part Superconducting layer UL.

The pickup coil 6 is a coil of one turn and is provided along an outer circumference of the substrate 21. This makes a magnetic field capturing area for an external magnetic field B as great as possible. One end of the pickup coil 6 is connected to one end of the SQUID inductor 4 via a wiring 11 formed on the upper part superconducting layer UL. Another end of the SQUID inductor 4 is connected to one end of the input coil 5 via a superconducting contact (region) 13 which connects the lower part superconducting layer DL with the upper part superconducting layer UL. The input coil 5 is a coil of multiple turns, in the illustration of FIG. 1A, of 3 turns. In planar view, the input coil 5 is arranged close to the outside of the SQUID 2 (SQUID inductor 4), and the SQUID 2 (SQUID inductor 4) is arranged close to the inside of the input coil 5. In planar view, each turn of the input coil 5 surrounds the SQUID 2 (SQUID inductor 4). Moreover, in planar view, the superconducting contact (region) 13 is provided inside the winding (turns) of the input coil 5 and outside the SQUID 2 (SQUID inductor 4). Another end of the input coil 5 is connected to another end of the pickup coil 6 via a superconducting contact (region) 12 which connects the lower part superconducting layer DL with the upper part superconducting layer UL.

More specifically, in the high-temperature superconducting magnetic sensor 1, the pickup coil 6, the SQUID inductor 4 (SQUID 2) and the input coil 5 are connected in series to constitute a closed loop 7. By this configuration, the shielding current $I_p$ which is generated in and flows through the pickup coil 6 by the external magnetic field B flows directly through the SQUID inductor 4 to be able to be current-coupled, in the same manner as the directly-coupled type SQUID. Moreover, the shielding current $I_p$ which flows through the pickup coil 6 by the external magnetic field B flows directly through the input coil 5 to generate a magnetic field proportional to the external magnetic field B in the input coil 5, in the same manner as the Ketchen-type SQUID. The pickup coil 6 and the input coil 5 function as a magnetic flux transformer. Since each turn of the input coil 5 surrounds the SQUID 2 (SQUID inductor 4), the input coil 5 is magnetically coupled with the SQUID (SQUID inductor 4). The magnetic field proportional to the external magnetic field B generated in the input coil 5 is applied to the SQUID 2 (SQUID inductor 4). As a result, it is possible to improve the coupling coefficient k much further than in the prior art directly-coupled type SQUID.

On the other hand, since each turn of the input coil 5 is not stacked on the SQUID inductor 4, it is possible to suppress capacitance component between the input coil 5 and the SQUID inductor 4 smaller than in the prior art Ketchen-type SQUID. This makes it possible to suppress a generation of LC resonance.

Note that the pickup coil 6 doubles as an electrode 9. Measurement of the magnetic field B by the high-temperature superconducting magnetic sensor 1 includes flowing a bias current between the electrode 9 (pickup coil 6) and the electrode 8 and measuring a voltage therebetween. The pickup coil 6 is large compared with the electrode 8, and an external terminal can be easily connected to the pickup coil 6 which can be used as the electrode 9. The electrode 9 is connected via the wiring 11 to the upper part superconducting layer UL (SQUID inductor 4) of the SQUID 2. Moreover, the electrode 8 is connected via a superconducting contact (region) 14 which connects the lower part superconducting layer DL with the upper part superconducting layer UL, to the lower part superconducting layer DL of the SQUID 2. In planar view, the superconducting contact (region) 14 is provided inside the winding (turns) of the input coil 5 and outside the SQUID 2 (SQUID inductor 4).

FIG. 1B illustrates an enlarged view of the circumference of the SQUID 2 in FIG. 1A. The SQUID 2 includes two Josephson junctions 3a,3b, and the SQUID inductor 4. The two Josephson junctions 3a,3b and the SQUID inductor 4 are connected in series, and the SQUID 2 has a closed loop structure. In the illustration of FIG. 1B, the Josephson junctions 3a, 3b are described as ramp-edge type Josephson junctions.

The Josephson junctions 3a,3b have a two-layered structure in which the upper part superconducting layer UL is deposited on the ramp-edge of the lower part superconducting layer DL. Namely, with positions of the two Josephson junctions 3a, 3b as the boundary, one portion constitutes the lower part superconducting layer DL and the other portion constitutes the upper part superconducting layer UL. A lower part superconducting region DL1 is provided at the side of the lower part superconducting layer DL which is one portion of the two Josephson junctions 3a,3b. The lower part superconducting region DL1 is connected to a wiring 17 of the upper part superconducting layer UL, in the superconducting contact (region) 14 inside the input coil 5. The wiring 17 steps over above the input coil 5 and is connected to the electrode 8 of the upper part superconducting layer UL outside the input coil 5.

The SQUID inductor 4 is connected to the upper part superconducting layer UL which is the other portion of the two Josephson junctions 3a,3b. The SQUID inductor 4 is of a slit hole type, and the magnetic flux trapping area S of the SQUID 2 (SQUID inductor 4) is of a slit shape (rectangle) with a great horizontal to vertical ratio. The SQUID inductor 4 can be considered as a coil of one turn. A line width W2 of the SQUID inductor 4 and a line width W3 of the input coil 5 (51,52,53) are nearly equal to each other (W2=W3). This makes it possible to pass an electric current of the same level of largeness through the SQUID inductor 4 and the input coil 5 (51,52,53). The SQUID inductor 4 and the input coil (51, 52,53) are connected in series, through which a shielding current $I_p$ which is an electric current of the same largeness flows.

Moreover, the line width W2 of the SQUID inductor 4 is 5 µm or less. The line width W2 of the SQUID inductor 4 is not wide as that of a washer type SQUID inductor in the prior art Ketchen-type SQUID, but is formed narrow as that of a slit hole type SQUID inductor in the prior art directly-coupled SQUID. Therefore, as for the SQUID inductor 4, magnetic flux trapping does not occur even when cooling in the geomagnetic field and highly-sensitive measurement is possible even in a shieldless environment such as in the geomagnetic field.

Moreover, a width W1 of the magnetic flux trapping area S of the SQUID 2 in an array direction in which a pair of Josephson junctions 3a,3b are arrayed is approximately equal to a distance d between the pair of Josephson junctions 3a, 3b (W1=d). This makes it possible to use the SQUID 2 as a slit hole type SQUID employed in the directly-coupled SQUID.

A wiring 11 is connected to a connection part between one end of the SQUID inductor 4 and the Josephson junction 3a. The wiring 11 steps over the input coil 5 and is connected to one end of the pickup coil 6 outside the input coil 5. An upper part superconducting region UL1 is connected to a connection part between another end of the SQUID inductor 4 and the Josephson junction 3b. The upper part superconducting region UL1 is connected to the innermost circumferential turn 51 of the input coil 5 on the lower part superconducting layer DL, in the superconducting contact (region) 13. The turn 53 which is the third from the inside and on the outermost circumference of the input coil 5 is connected to one end (another end) of the pickup coil 6, in the superconducting contact (region) 12. One end of the pickup coil 6 is directly connected to one end of the SQUID inductor 4, and another end of the pickup coil 6 is connected via the input coil 5 to another end of the SQUID inductor 4.

Figure 1C:
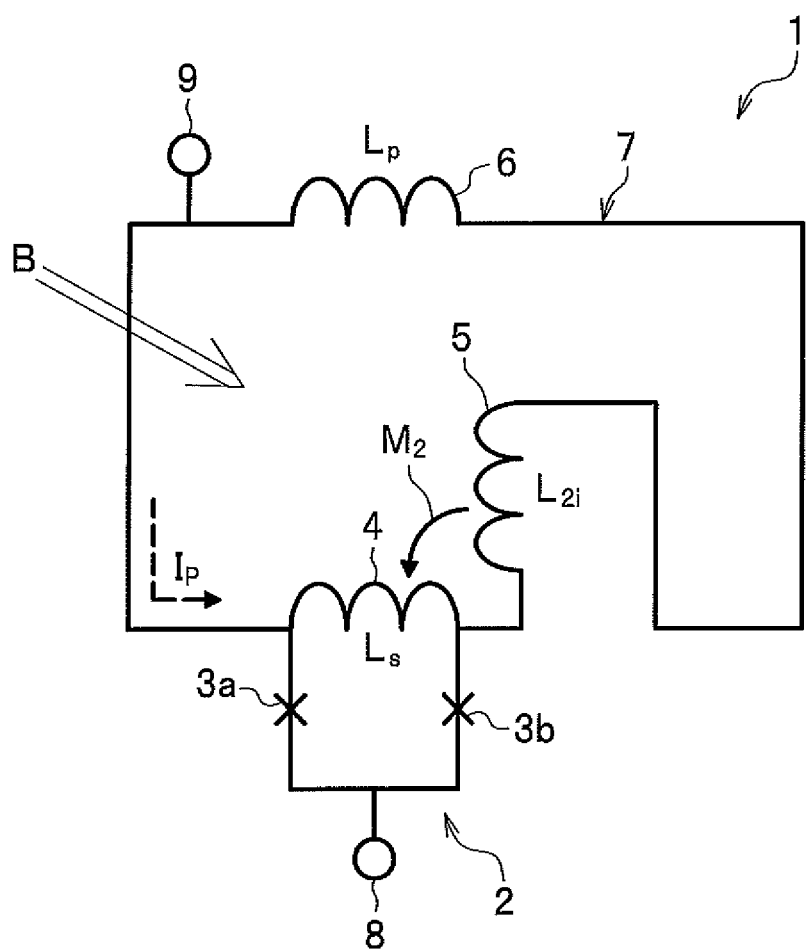
FIG. 1C is a circuit diagram of the high-temperature superconducting magnetic sensor according to the first embodiment of the present invention.

FIG. 1C illustrates a circuit diagram of the high-temperature superconducting magnetic sensor 1 according to the first embodiment of the present invention. As described above, it is understood that in the high-temperature superconducting magnetic sensor 1, the pickup coil 6, the SQUID inductor 4 (SQUID 2) and the input coil 5 are connected in series to constitute a closed loop 7. Assuming that an inductance of the SQUID inductor is $L_s$, an area of the magnetic flux trapping area of the pickup coil 6 is $A_p$, an inductance of the pickup coil 6 is $L_p$, an inductance of the input coil 5 is $L_{2i}$, and a mutual inductance between the SQUID inductor 4 and the input coil 5 is $M_2$, a magnetic flux $\Phi_s$ detected by the SQUID 2 when the external magnetic field B is applied to the pickup coil 6 has the relation of formula (5).

$$\Phi_s = I_p \cdot (L_s + M_2) \quad (5)$$
$$= BA_p \cdot (L_s + M_2) / (L_p + L_s + L_{2i})$$

Here, $I_p$ is a shielding current which flows through the magnetic flux transformer 7 (pickup coil 6), and the mutual inductance $M_2$ has the relation of formula $M_2 = k(L_{2i} \cdot L_s)^{1/2}$ where k is a coupling coefficient (0<k<1). The effective area $A_{eff}$ which is a ratio of the magnetic flux $\Phi_s$ detected by the SQUID 2 to the external magnetic field B has the relation of formula (6).

$$A_{eff} = \Phi_s / B \quad (6)$$
$$= A_p \cdot (L_s + M_2) / (L_p + L_s + L_{2i})$$
$$= A_p \cdot L_s \cdot (1 + k(L_{2i}/L_s)^{1/2}) / (L_p + L_s + L_{2i})$$

(Second embodiment)

FIG. 2A illustrates a plan view of a high-temperature superconducting magnetic sensor 1 according to a second embodiment of the present invention. In the high-temperature superconducting magnetic sensor 1, three SQUIDs 2a, 2b, 2c and two input coils 5a, 5b are connected in series with one pickup coil 6. The SQUID 2c located in the center is expected to be capable of measuring with the same sensitivity as that in the prior art directly-coupled SQUID. The SQUIDs 2a, 2b located in the left and right sides make it possible to measure the magnetic field B with high sensitivity in the same manner as the SQUID 2 according to the first embodiment because the input coils 5a, 5b are arranged around the respective directly-coupled SQUIDs. Since the three SQUIDs 2a, 2b, 2c can be simultaneously manufactured, the SQUID 2c can be used as a reference for comparison with the SQUIDs 2a, 2b. Note that if the comparison is unnecessary, the SQUID 2c may be omitted. As for the two SQUIDs 2a, 2b, it is possible to use one having superior characteristics depending on the intended use, and it is only necessary for any one of them to pass a test of product inspection. Therefore, it is possible to increase a product yield of the high-temperature superconducting magnetic sensor 1. Note that measurement of the magnetic field B includes: when the SQUID 2a is used, flowing a bias current between the electrode 9 (pickup coil 6) and the electrode 8a and measuring a voltage therebetween; when the SQUID 2b is used, flowing a bias current between the electrode 9 and the electrode 8b and measuring a voltage therebetween; and when the SQUID 2c is used, flowing a bias current between the electrode 9 and the electrode 8c and measuring a voltage therebetween.

The configuration comprised of the pickup coil 6, the SQUID 2a, the input coil 5a and the electrode 8a is the same as the configuration comprised of the pickup coil 6, the SQUID 2, the input coil 5 and the electrode 8 in the high-temperature superconducting magnetic sensor 1 of the first embodiment. Namely, in the first embodiment, the SQUID 2 can be read as the SQUID 2a, the input coil 5 can be read as the input coil 5a, and the electrode 8 can be read as the electrode 8a.

Moreover, the configuration comprised of the pickup coil 6, the SQUID 2b, the input coil 5b and the electrode 8b, and the configuration comprised of the pickup coil 6, the SQUID 2a, the input coil 5a and the electrode 8a, have a relationship of mirror image with each other.

The pickup coil 6 is a coil of one turn and is provided along the outer circumference of the substrate 21. One end of the pickup coil 6 is connected via the wiring 11 which steps over the input coil 5a, to one end of the SQUID inductor 4a which is part of the SQUID 2a. Another end of the SQUID inductor 4a is connected via the superconducting contact (region) 13 to one end of the input coil 5a. Another end of the input coil 5a is connected to one end of the SQUID inductor 4c which is part of the SQUID 2c and formed on the lower part superconducting layer DL. Another end of the SQUID inductor 4c is connected to one end of the input coil 5b. Another end of the input coil 5b is connected via the superconducting contact (region) 13 to one end of the SQUID inductor 4b which is part of the SQUID 2b. Another end of the SQUID inductor 4b is connected via the wiring 11 which steps over the input coil 5b, to another end of the pickup coil 6.

More specifically, in the high-temperature superconducting magnetic sensor 1, the pickup coil 6, the SQUID inductor 4a (SQUID 2a), the input coil 5a, the SQUID inductor 4c (SQUID 2c), the input coil 5b and the SQUID inductor 4b (SQUID 2b) are connected in this order in series to constitute a closed loop 7. By this configuration, the shielding current $I_p$ which is generated in and flows through the pickup coil 6 by the external magnetic field B flows directly through the SQUID inductors 4a,4c,4b to be able to be current-coupled, in the same manner as the directly-coupled type SQUID. Moreover, the shielding current $I_p$ which flows through the pickup coil 6 by the external magnetic field B flows directly through the input coils 5a,5b to generate a magnetic field proportional to the external magnetic field B in the input coils 5a,5b, in the same manner as the Ketchen-type SQUID. The pickup coil 6 and the input coils 5a, 5b function as a magnetic flux transformer. Since each turn of the input coils 5a,5b surrounds the SQUIDs 2a,2b (SQUID inductors 4a, 4b), the input coils 5a, 5b are magnetically coupled with the SQUIDs 2a, 2b (SQUID inductors 4a,4b). The magnetic field proportional to the external magnetic field B generated in the input coils 5a,5b is applied to the SQUIDs 2a,2b (SQUID inductors 4a,4b). As a result, it is possible to improve the coupling coefficient k much further than in the prior art directly-coupled type SQUID. On the other hand, since the input coils 5a,5b are not stacked on the SQUID inductors 4a,4b, it is possible to suppress capacitance components between the input coils 5a, 5b and the SQUID inductors 4a, 4b smaller than in the prior art Ketchen-type SQUID. This makes it possible to suppress a generation of LC resonance.

Note that the pickup coil 6 doubles as an electrode 9. Measurement of the magnetic field B by the SQUID 2a includes flowing a bias current between the electrode 9 (pickup coil 6) and the electrode 8a and measuring a voltage therebetween. Measurement of the magnetic field B by the SQUID 2b includes flowing a bias current between the electrode 9 (pickup coil 6) and the electrode 8b and measuring a voltage therebetween. Measurement of the magnetic field B by the SQUID 2c includes flowing a bias current between the electrode 9 (pickup coil 6) and the electrode 8c and measuring a voltage therebetween.

The electrode 9 (pickup coil 6) is connected via the wiring 11 to the upper part superconducting layer UL (SQUID inductors 4a, 4b) of the SQUIDs 2a,2b, and further via the superconducting contact (region) 13 and the input coils 5a(5b) to the lower part superconducting layer DL (SQUID inductor 4c) of the SQUID 2c. Moreover, the electrodes 8a, 8b are connected via the superconducting contact (region) 14 to the lower part superconducting layer DL of the SQUIDs 2a,2b. The electrode 8c is connected to the upper part superconducting layer UL of the SQUID 2c.

FIG. 2B illustrates an enlarged view of the circumference of the SQUIDs 2a,2c in FIG. 2A. AS for the SQUID 2a, the structure is the same as that of the SQUID 2 in FIG. 1B and thus explanation thereof is omitted. The SQUID 2c includes two Josephson junctions 3a,3b and the SQUID inductor 4c. The two Josephson junctions 3a,3b and the SQUID inductor 4c are connected in series, and the SQUID 2c has a closed loop structure. In the illustration of FIG. 2B, the Josephson junctions 3a, 3b of the SQUID 2c are described as ramp-edge type Josephson junctions. The Josephson junctions 3a,3b of the SQUID 2c have a two-layered structure in which the upper part superconducting layer UL on the side of the electrode 8c is formed (joined) on the ramp-edge of the lower part superconducting layer DL on the side of the SQUID inductor 4c.

Moreover, in order to facilitate comparison with the SQUIDs 2a,2b, the SQUID inductor 4c has the same size as those of the SQUID inductors 4a,4b so that the inductance of the SQUID inductor 4c is equal to those of the SQUID inductors 4a,4b.

Figure 2C:
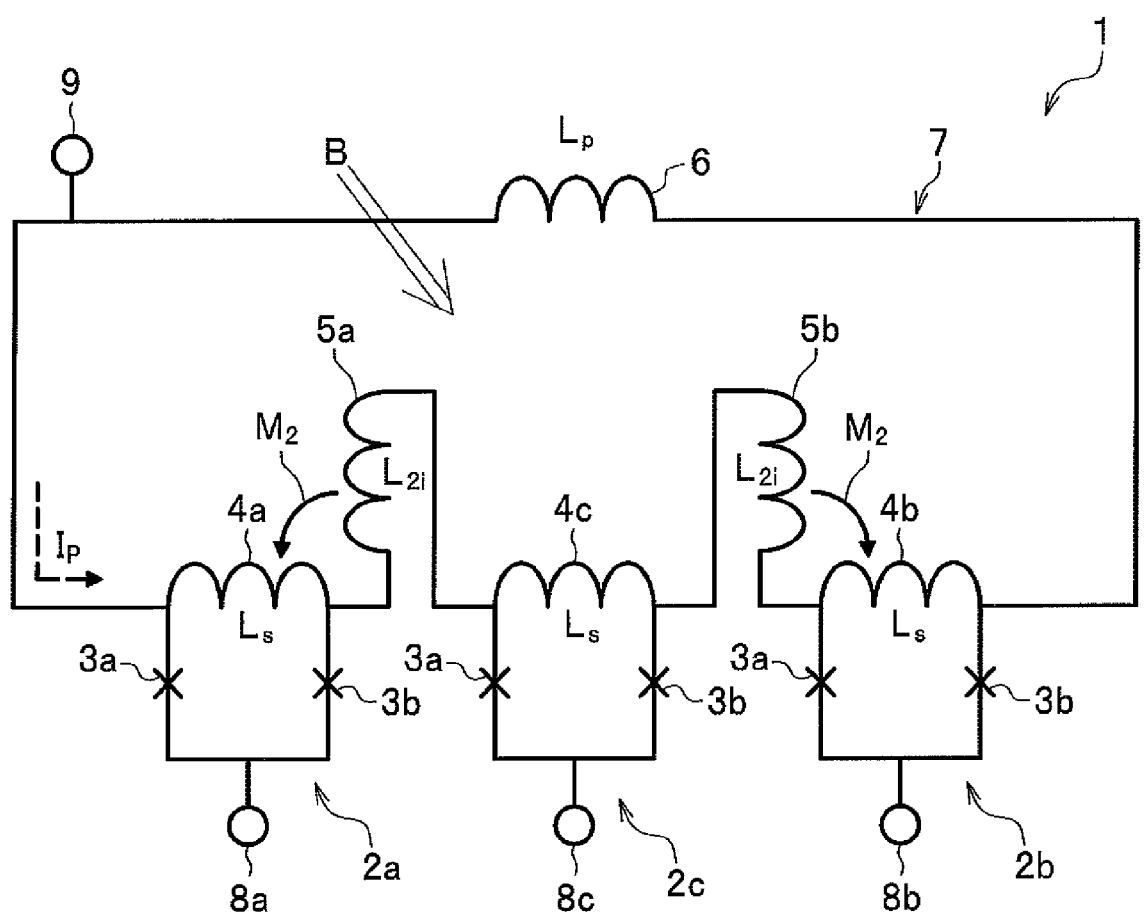
FIG. 2C is a circuit diagram of the high-temperature superconducting magnetic sensor according to the second embodiment of the present invention.

FIG. 2C illustrates a circuit diagram of the high-temperature superconducting magnetic sensor 1 according to the second embodiment of the present invention. As described above, it is understood that in the high-temperature superconducting magnetic sensor 1, the pickup coil 6, the SQUID inductor 4a (SQUID 2a), the input coil 5a, the SQUID inductor 4c (SQUID 2c), the input coil 5b and the SQUID inductor 4b (SQUID 2b) are connected in this order in series to constitute the closed loop 7.

FIGS. 3A to 3D show cross-sectional views in process of manufacture of the high-temperature superconducting magnetic sensor 1 according to the second embodiment of the present invention. Note that FIGS. 3A to 3D are cross-sectional views taken in the arrow direction of A-A line.

Figure 3A:
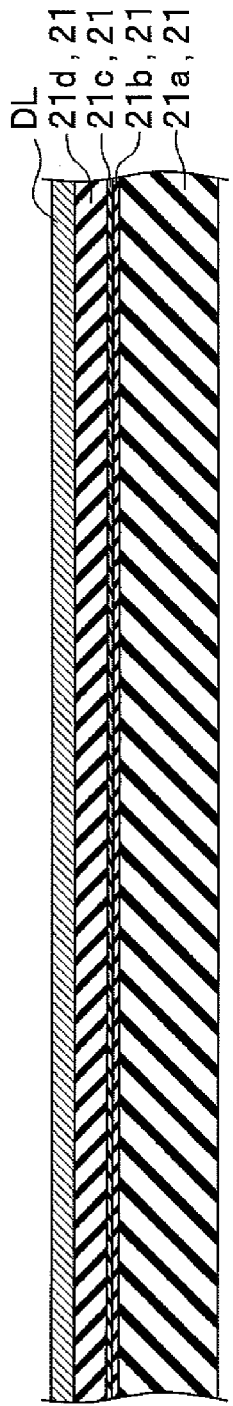

Firstly, as shown in FIG. 3A, a substrate 21 of four-layered structure was formed. A magnesium oxide (MgO(100)) substrate 21a with a size of 15×15 mm$^2$ was used, on which a BaZrO$_3$ layer with a film thickness of 5 nm as an orientation control buffer layer 21b, a Pr$_{1.4}$Ba$_{1.6}$Cu$_{2.6}$Ga$_{0.4}$O$_y$ layer with a film thickness of 300 nm as a black heat absorbing layer 21c, and a SrSnO$_3$ layer with a film thickness of 250 nm as a lower part insulation layer 21d, were deposited in this order by off-axis sputtering. Next, on the formed substrate 21, a SmBa$_2$Cu$_3$O$_y$ (SmBCO) layer with a film thickness of 250 nm as the lower part superconducting layer (first superconducting layer) DL was deposited by off-axis sputtering.

Figure 3B:
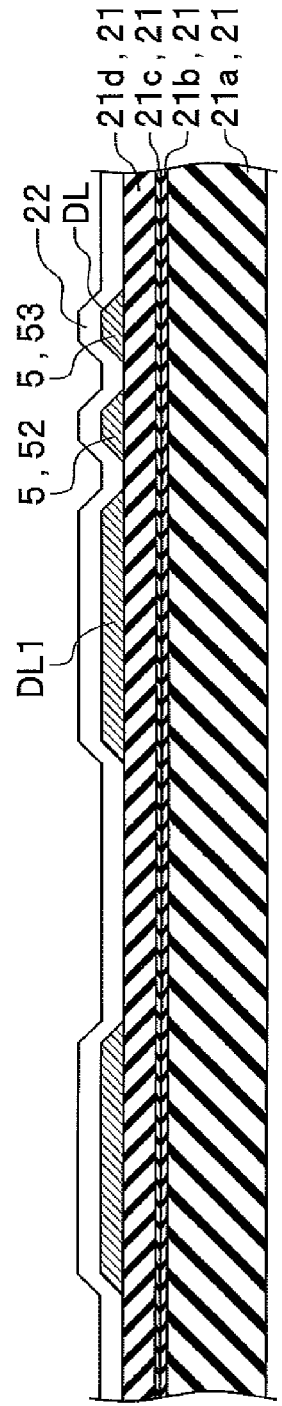

Then, as shown in FIG. 3B, the lower part superconducting layer (first superconducting layer) DL was processed to be an intended circuit pattern shape (for example, pattern shape of part of the input coil 5 (52,53) and the lower part superconducting region DL1). Note, the input coil 51 (see FIG. 2B) is omitted in the description of FIGS. 3A to 3D to avoid FIGS. 3A to 3D being complicated (the same shall apply hereafter). Formation of circuit patterns was made by photolithography and dry etching method using ion milling.

Figure 3C:
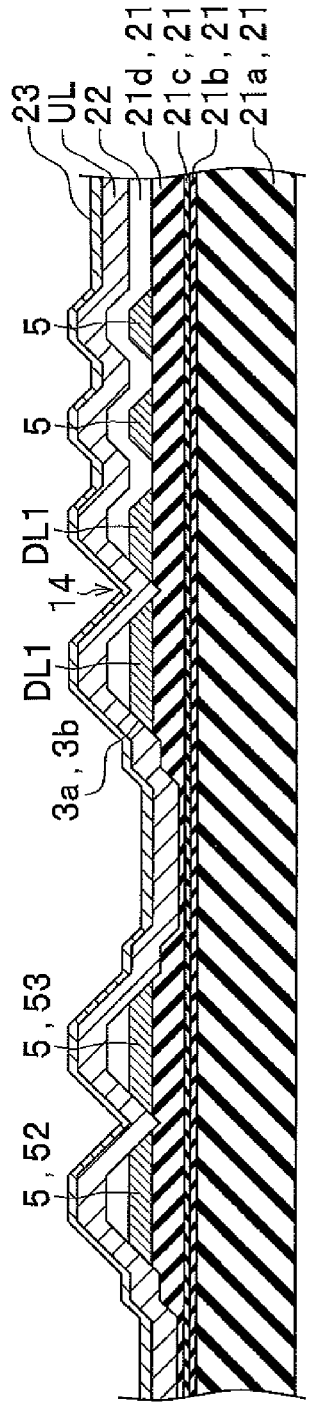

Next, as shown in FIG. 3B, as an interlayer insulation layer 22, a SrSnO$_3$ (SSO) layer with a film thickness of 280 nm was formed by off-axis sputtering. Then, as shown in FIG. 3C, the interlayer insulation layer 22 was processed to be an intended circuit pattern shape. Formation of circuit patterns was made by photolithography and dry etching method using ion milling. By the etching of the interlayer insulation layer 22, the ramp slope of the ramp-edge type Josephson junctions 3a,3b and the ramp slope for connection (the superconducting contact region 14 and the like) of the lower part superconducting layer (first superconducting layer) DL and the upper part superconducting layer (second superconducting layer) UL were formed on the interlayer insulation layer 22 and the lower part superconducting layer DL. Also, by the etching of the interlayer insulation layer 22, the lower part superconducting layer DL together with the interlayer insulation layer 22 was processed to be an intended circuit pattern shape (for example, pattern shape of the remaining part of the input coil 5 (52,53)). Namely, this etching etches the lower part superconducting layer (first superconducting layer) DL simultaneously with the interlayer insulation layer 22.

Next, as shown in FIG. 3C, as the upper part superconducting layer (second superconducting layer) UL, a La$_{0.1}$—Er$_{0.95}$Ba$_{1.95}$Cu$_3$O$_y$ (L1ErBCO) layer with a film thickness of 250 nm was formed by laser deposition method. The upper part superconducting layer UL is formed on the ramp slope of the lower part superconducting layer (first superconducting layer) DL of the ramp-edge type Josephson junctions 3a,3b to thereby complete the ramp-edge type Josephson junctions 3a,3b. The upper part superconducting layer UL is formed on the ramp slope of the lower part superconducting layer DL of the superconducting contact region 14 and the like to thereby connect the lower part superconducting layer DL and the upper part superconducting layer UL. Furthermore, on the formed upper part superconducting layer UL, a gold layer with a film thickness of 100 nm as a gold (Au) electrode layer 23 was formed by sputtering.

Figure 3D:
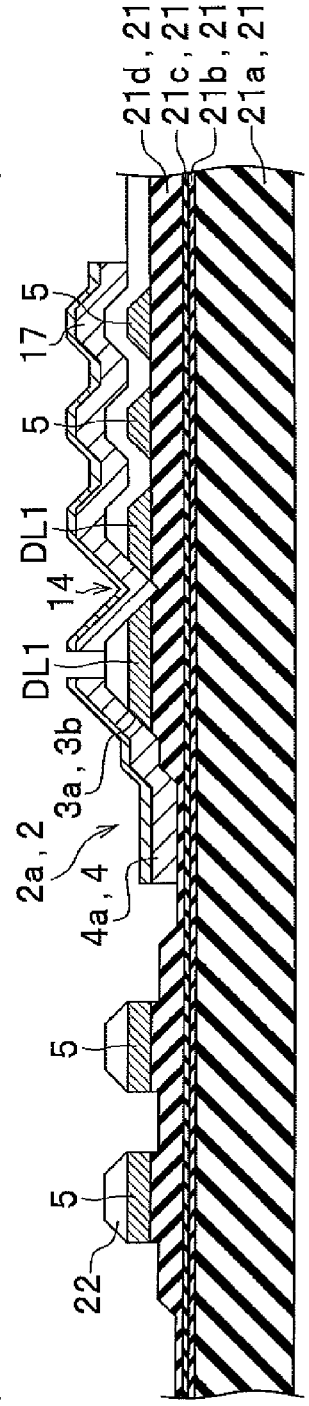

Then, as shown in FIG. 3D, the gold electrode layer 23 and the upper part superconducting layer UL were processed to be an intended circuit pattern shape (for example, pattern shape of the SQUID inductor 4a, the pickup coil 6, the electrode 8a and the like). Note, as for the input coil 5 in a region above which the wiring 17 of the upper part superconducting layer UL and the like are not arranged, the upper part superconducting layer UL is not only removed, but also portions of the ramp slope of the input coil 5 are etched with the interlayer insulation layer 22 used as a mask. This makes it possible to surely separate adjacent windings (turns) of the input coil 5 from one another. Formation of circuit patterns was made by photolithography and dry etching method using ion milling. Moreover, since the upper part superconducting layer UL and the gold electrode layer 23 (see FIG. 3C) are simultaneously etched, the entire surface of the upper part superconducting layer UL is coated by the gold electrode layer 23.

Next, the high-temperature superconducting magnetic sensor 1 was heated at 400 to 500 degrees Celsius in an oxygen atmosphere of 1 atmospheric pressure to be subject to heat treatment accompanied by oxidization of the lower part superconducting layer DL and the upper part superconducting layer UL. Finally, the high-temperature superconducting magnetic sensor 1 was hermetically packaged together with a heater element for heating to be thereby completed.

Figure 4A:
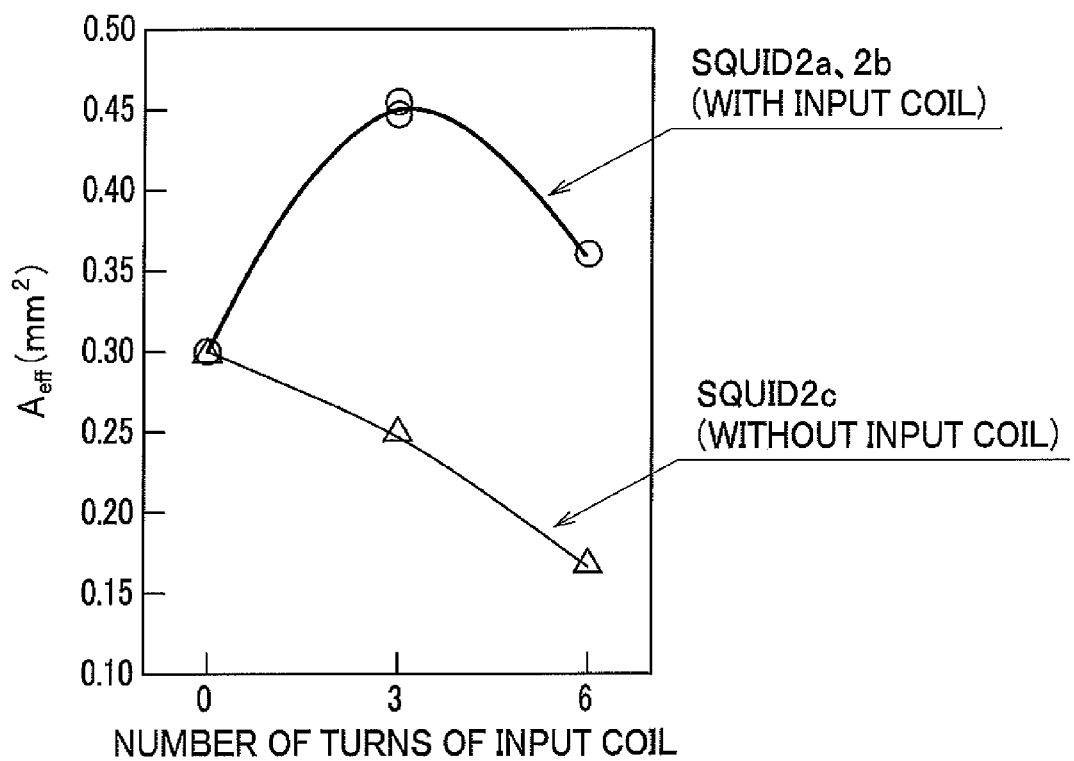
FIG. 4A is a graph representing a relationship between the effective area $A_{eff}$ in the SQUIDs 2a, 2c provided in the high-temperature superconducting magnetic sensor according to the second embodiment of the present invention, and the number of turns of the input coil.

FIG. 4A shows a graph representing a relationship between the effective area $A_{eff}$ in the SQUIDs 2a, 2b, 2c provided in the high-temperature superconducting magnetic sensor 1 according to the second embodiment of the present invention, and the number of turns of the input coils 5a, 5b. As the number of turns of the input coils 5a, 5b, the cases of 0 (zero) turn (the input coils 5a, 5b omitted), turns and 6 turns are described. Although in the example illustrated in FIG. 2A, explanation has been given of the case of 3 turns as the number of turns of the input coils 5a,5b, in addition to this, a high-temperature superconducting magnetic sensor 1 in which the number of turns of the input coils 5a,5b is 0 turn, and a high-temperature superconducting magnetic sensor 1 in which the number of turns of the input coils 5a,5b is 6 turns, were also made. Note that for the high-temperature superconducting magnetic sensor in which the number of turns of the input coils 5a,5b is 0 turn, a high-temperature superconducting magnetic sensor provided with a prior art directly-coupled type (slit hole type) SQUID may be used.

Measurement of the effective area $A_{eff}$ was performed as described later. Firstly, the high-temperature superconducting magnetic sensor 1 was dipped in liquid nitrogen to be cooled. Then, feedback control using a flux locked loop circuit (FLL circuit) was performed to bring the high-temperature superconducting magnetic sensor 1 into a state enabling a magnetic measurement. Then, in order to generate the external magnetic field B, a solenoid coil with a diameter of 150 mm, a length of 450 mm and a coil constant of 5.09 mT/A was prepared and the high-temperature superconducting magnetic sensor 1 was arranged in the center of the solenoid coil. Bypassing an electric current (70 Hz, sine wave) of 19.17 $\mu A_{pp}$ (peak to peak) through the solenoid coil, the external magnetic field B of 97.5 $nT_{pp}$ was generated and then applied perpendicularly to the face (magnetic flux trapping area) of the pickup coil 6 in the high-temperature superconducting magnetic sensor 1. From the ratio ($\Phi_s/B$, see the formula (2)) of the magnetic flux $\Phi_s$ detected by the respective SQUIDs 2a,2b,2c of the high-temperature superconducting magnetic sensor 1 at this time to the external magnetic field B, the effective area $A_{eff}$ which represents a detection efficiency as a magnetic sensor for each of the SQUIDs 2a,2b,2c was calculated. Note that the respective inductances $L_s$ of the SQUID inductors 4a,4b,4c of the SQUIDs 2a,2b,2c were all approximately 55 pH and the same.

"o"-marked data in FIG. 4A shows dependence of the effective area $A_{eff}$ of the SQUID 2a surrounded by the input coil 5a on the number of turns of the input coil 5a. "o"-marked data for the number of turns of the input coil 5a being 0 turn is the effective area $A_{eff}$ of a prior art directly-coupled type SQUID measured using a high-temperature superconducting magnetic sensor provided with only the prior art directly-coupled type SQUID. The "o"-marked data (effective area $A_{eff}$) for 0 turn was 0.3 mm².

"o"-marked data for the number of turns of the input coil 5a being 3 turns is the effective area $A_{eff}$ of the SQUID 2a surrounded by the input coil 5a of 3 turns. The "o"-marked data (effective area $A_{eff}$) for 3 turns was measured twice in order to confirm reproducibility and was 0.45 mm² and 0.44 mm². Moreover, measurement was made also for the SQUID 2b and the effective area $A_{eff}$ equivalent to that of the SQUID 2a was obtained.

"o"-marked data for the number of turns of the input coil 5a being 6 turns is the effective area $A_{eff}$ of the SQUID 2a surrounded by the input coil 5a of 6 turns. The "o"-marked data (effective area $A_{eff}$) for 6 turns was 0.36 mm². Moreover, measurement was made also for the SQUID 2b and the effective area $A_{eff}$ equivalent to that of the SQUID 2a was obtained.

From the above, compared with the effective area $A_{eff}$ (0.3 mm²) for the number of turns of the input coil 5a being 0 turn, the effective area $A_{eff}$ (0.45 mm²) for 3 turns increased by 1.5 times, and the effective area $A_{eff}$ (0.36 mm²) for 6 turns increased by 1.2 times. When the "o"-marked data is smoothly connected by a solid line, the effective area $A_{eff}$ for the SQUIDs 2a,2b is considered to increase even if the number of turns of the input coils 5a,5b is 1 turn, compared with 0 turn. From this, it is considered that the input coils 5a,5b are effective in an increase of the effective area $A_{eff}$ and have the effect even if the number of turns thereof is 1 turn. Note, considering theoretically, the more the number of turns becomes, the more the magnetic coupling (coupling coefficient k) also increases and thus the effective area $A_{eff}$ should increase. However, the effective area $A_{eff}$ (0.36 mm²) for the number of turns of the input coils 5a,5b being 6 turns becomes smaller than the effective area $A_{eff}$ (0.45 mm²) for 3 turns. In order to explain the cause of this discrepancy, dependence property of the effective area $A_{eff}$ of the SQUID 2c relative to the number of turns of the input coils 5a,5b was evaluated (measured) as described below.

"Δ"-marked data in FIG. 4A shows dependence property of the effective area $A_{eff}$ of the SQUID 2c not surrounded by the input coils 5a,5b (without the input coils 5a,5b) relative to the number of turns of the input coils 5a,5b. "Δ"-marked data for the number of turns of the input coils 5a,5b being 0 turn is the effective area $A_{eff}$ of a prior art directly-coupled type SQUID measured using a high-temperature superconducting magnetic sensor provided with only the prior art directly-coupled type SQUID. Namely, the "Δ"-marked data (effective area $A_{eff}$) for 0 turn is the same as the "o"-marked data (effective area $A_{eff}$) for 0 turn and is 0.3 mm².

"Δ"-marked data for the number of turns of the input coil 5a being 3 turns is the effective area $A_{eff}$ of the SQUID 2c which is outside the input coils 5a,5b of 3 turns and is not surrounded. The "Δ"-marked data (effective area $A_{eff}$) for 3 turns was 0.25 mm².

"Δ"-marked data for the number of turns of the input coil 5a being 6 turns is the effective area $A_{eff}$ of the SQUID 2c which is outside the input coils 5a,5b of 6 turns and is not surrounded. The "Δ"-marked data (effective area $A_{eff}$) for 6 turns was 0.17 mm².

From the above, the trend was obtained in which the effective area $A_{eff}$ of the SQUID 2c decreases monotonically as the number of turns of the input coils 5a,5b increases. This was considered to be due to that the input coils 5a,5b are connected in series to the closed loop 7 including the pickup coil 6 through which the shielding current $I_p$ flows, and accordingly, the inductance $L_{2i}$ of the input coils 5a,5b increased by an increase of the number of turns and the shielding current $I_p$ decreased. Moreover, since the inductance $L_{2i}$ of the input coils 5a,5b generally increases in proportion to the square of the number of turns, a decrease ratio of the effective area $A_{eff}$ by an increase of the number of turns becomes high as the number of turns increases. Namely, with respect to the effective area $A_{eff}$ of the SQUIDs 2a,2b ("o"-marked data in FIG. 4A), the reason for which the effective area $A_{eff}$ (0.36 mm²) for the number of turns of the input coils 5a,5b being 6 turns became smaller than the effective area $A_{eff}$ (0.45 mm²) for 3 turns was considered to be due to that the shielding current $I_p$ decreased with the increase in the inductance $L_{2i}$ of the input coils 5a,5b. Compared with the amount of increase in the inductance $L_{2i}$ (the amount of decrease in the shielding current $I_p$) in the case of the number of turns of the input coils 5a,5b being increased from 0 turn to 3 turns, the amount of increase in the inductance $L_{2i}$ (the amount of decrease in the shielding current $I_p$) in the case of being increased from 3 turns to 6 turns was greater. From this, it was considered that, in the case of the number of turns being increased from 0 turn to 3 turns, the effective area $A_{eff}$ increased because its increase surpassed its decrease, while in the case of being increased from 3 turns to 6 turns, the effective area $A_{eff}$ decreased because its decrease surpassed its increase.

Figure 4B:
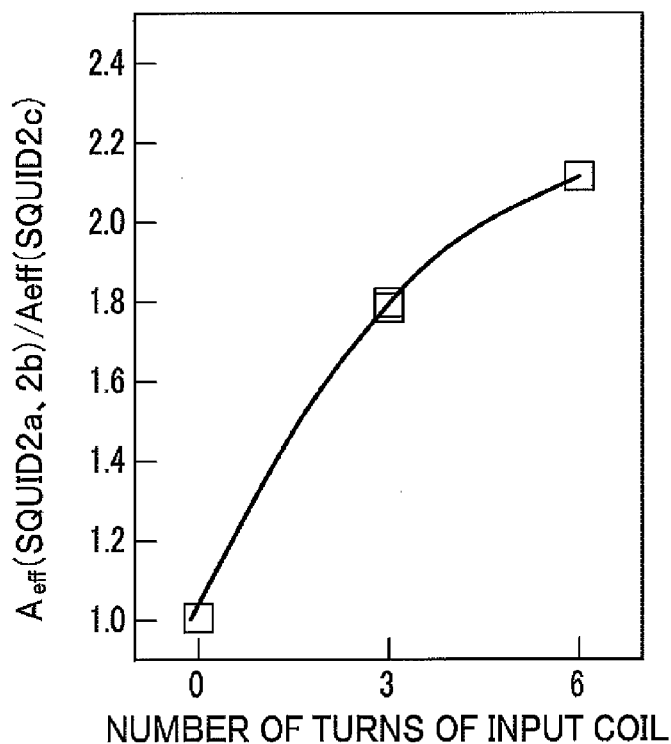
FIG. 4B is a graph representing a relationship between the ratio of the effective area $A_{eff}$ of the SQUID 2a (SQUID 1) to the effective area $A_{eff}$ of the SQUID 2c (SQUID 2), provided in the high-temperature superconducting magnetic sensor according to the second embodiment of the present invention, and the number of turns of the input coil.

FIG. 4B shows a graph representing a relationship between the ratio of the effective area $A_{eff}$ of the SQUIDs 2a,2b ("o"-marked data in FIG. 4A) to the effective area $A_{eff}$ of the SQUID 2c ("Δ"-marked data in FIG. 4A), provided in the high-temperature superconducting magnetic sensor 1 according to the second embodiment of the present invention, and the number of turns of the input coils 5a,5b. Namely, FIG. 4B ("□"-marked data) shows values of the "o"-marked data (values) divided by the "Δ"-marked data (values) for 0 turn, 3 turns and 6 turns, respectively, of the number of turns of the input coils 5a,5b in FIG. 4A. It is considered that the effect by the decrease in the shielding current $I_p$ with the increase in the inductance $L_2$ affects the "o"-marked data and the "Δ"-marked data for the same number of turns in FIG. 4A, to the same degree. In view of this, by calculating a ratio of the "o"-marked data to the "Δ"-marked data, it is possible to remove the effect. Moreover, by calculating the ratio of the "o"-marked data to the "Δ"-marked data, it is possible to evaluate the condition in which the magnetic coupling (coupling coefficient k) increases with the increase in the number of turns of the input coils 5a,5b. It can be considered that FIG. 4B shows dependence of the magnetic coupling (coupling coefficient k) on the number of turns of the input coils 5a,5b. It can be seen from FIG. 4B that the magnetic coupling (coupling coefficient k) increases monotonically with the increase in the number of turns. Moreover, it was found that, compared with the amount of increase in the magnetic coupling (coupling coefficient k) in the case of the number of turns of the input coils 5a,5b being increased from 0 turn to 3 turns, the amount of increase in the magnetic coupling (coupling coefficient k) in the case of being increased from 3 turns to 6 turns was smaller. This is considered to be due to that when the number of turns increases in the case of a plane type coil such as the input coils 5a,5b, an outer diameter of the input coils 5a,5b increases (an outer diameter of the input coil 52 is greater than that of the input coil 51, and an outer diameter of the input coil 53 is greater than that of the input coil 52), and accordingly, the magnetic coupling between the outer input coil 53 (52) and the SQUID inductors 4a,4b decreased. Therefore, it is considered effective in sensitivity improvement to make the line width of the input coils 5a,5b thin, for example, to suppress an increase in the outer diameter of the input coil 53(52).

From the above description, it was found that the maximum effective area $A_{eff}$ and the number of turns of the input coils 5a,5b for which the maximum effective area $A_{eff}$ is obtained are determined by trade-off between the magnetic coupling (coupling coefficient k) increasing with the increase in the number of turns, and the shielding current $I_p$ decreasing (the inductance $L_2$ increasing) with the increase in the number of turns. From this, in the example of the "o"-marked data in FIG. 4A, the effective area $A_{eff}$ reaches its maximum when the number of turns of the input coils 5a,5b is 3 turns. The number of turns for which the effective area $A_{eff}$ reaches its maximum depends on shapes and structures of the input coils 5a,5b, the SQUID inductors 4a,4b and the like. When the number of turns is within the range of 1 turn or more and 6 turns or less, the maximum effective area $A_{eff}$ or the effective area $A_{eff}$ of largeness comparable to the maximum can be obtained.

Figure 5:
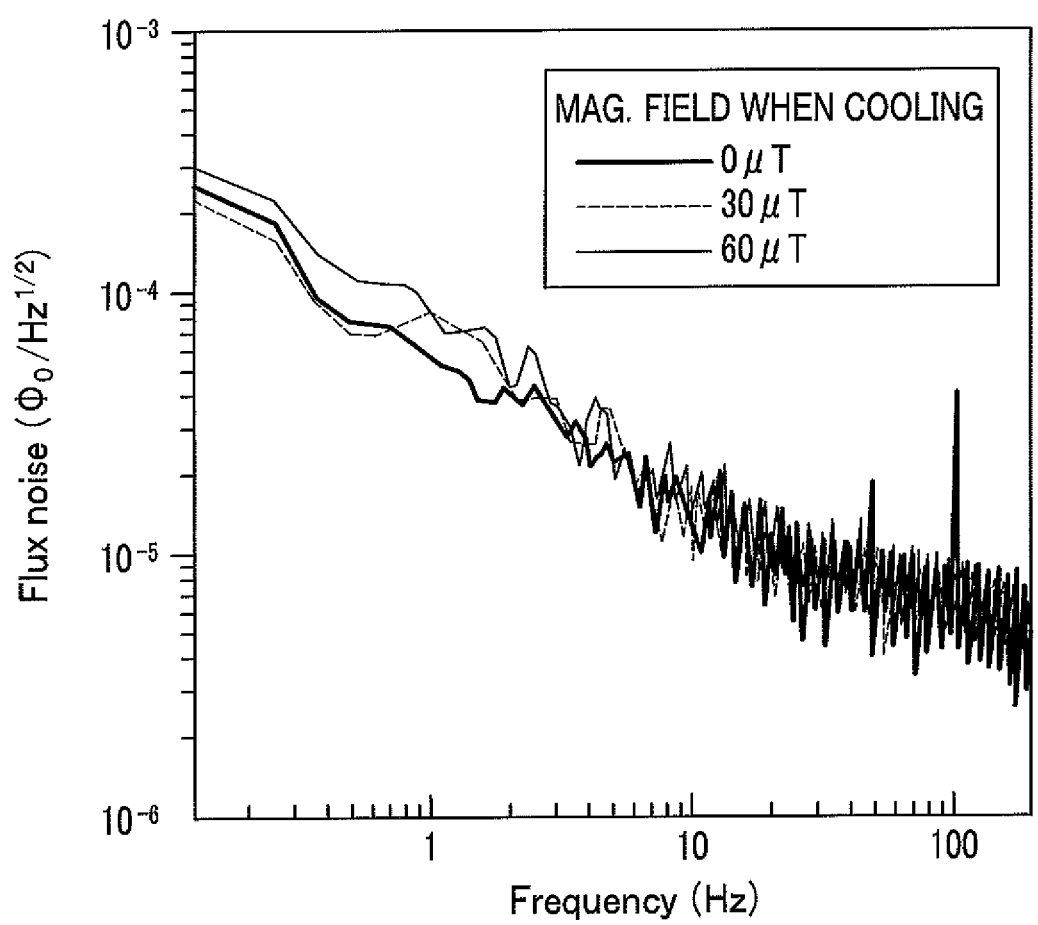
FIG. 5 is a graph representing noise characteristics of the high-temperature superconducting magnetic sensor according to the second embodiment of the present invention.

FIG. 5 shows a graph representing noise characteristics of the high-temperature superconducting magnetic sensor 1 according to the second embodiment of the present invention. The noise characteristics were measured as follows. Firstly, the high-temperature superconducting magnetic sensor 1 was dipped in liquid nitrogen and in the state of the external magnetic field B being applied, an electric current of 100 mA was passed for 15 seconds through the heater element packaged together with the sensor. After interruption of the current, the high-temperature superconducting magnetic sensor 1 was cooled again in the magnetic field. After this, noise spectra were measured as the noise characteristics. Since the high-temperature superconducting magnetic sensor 1 is heated up to a temperature higher than the superconducting critical temperature and is again cooled down to a temperature lower than the superconducting critical temperature, it is considered that when the temperature is higher than the superconducting critical temperature, the magnetic flux of the external magnetic field B enters the inside of the SQUID inductors 4a,4b. Then, a judgment of whether magnetic flux trapping occurred or not was made by the re-cooling. This judgment was made by comparing a noise spectrum measured when cooling in the external magnetic field B, with a noise spectrum measured when cooling in zero magnetic field not applying the external magnetic field B. When the intensity of the noise spectrum measured when cooling in the external magnetic field B increased much more than that of the noise spectrum measured when cooling in zero magnetic field, a judgment that the magnetic flux trapping occurred was made. Namely, as shown in FIG. 5, measurement of the noise spectra was made when the external magnetic field B at the re-cooling was zero magnetic field (0 μT) (judgment criterion spectrum), 30 μT and 60 μT. Note that although the external magnetic field B was generated by passing an electric current from a secondary battery through the solenoid coil, the noise spectra were measured with the external magnetic field B being removed (in zero magnetic field) after the temperature decreased by the re-cooling because noises derived from the secondary battery occurred in the state of the external magnetic field B being applied. The reason is that when magnetic flux trapping occurs during the cooling in the external magnetic field B, the magnetic flux trapped in the superconductor remains even if the external magnetic field B is removed to be zero magnetic field.

As shown in FIG. 5, the intensity of the noise spectrum measured when the external magnetic field B at the re-cooling was 30 μT, and the intensity of the noise spectrum measured at 60 μT, were similar to the intensity of the noise spectrum (judgment criterion spectrum) measured at zero magnetic field (0 μT), in the entire frequency band. From this, it was considered that magnetic flux trapping did not occur in the SQUID inductors 4a,4b even when the external magnetic field B at the re-cooling was 30 μT or 60 μT. Since 60 μT is a greater value than the geomagnetic field (e.g., 50 μT), the high-temperature superconducting magnetic sensor 1 enables a highly-sensitive magnetic measurement without generating magnetic flux trapping even in a shieldless environment. By contrast, according to the formula (3), when the width W2 (see FIG. 1B) of the SQUID inductors 4a,4b is 5 μm, the maximum magnetic field (threshold magnetic field) $B_{th}$ in which the superconductor can push out the magnetic flux outward becomes 65 μT, which supports our measuring result in which magnetic flux trapping did not occur at 60 μT and 30 μT.

According to the formula (3), when the width W2 is double, 10 μm, the $B_{th}$ becomes one-fourth, 16 μT. Even in this case, the direction of the geomagnetic field and the direction perpendicular to the superconducting thin film (upper part superconducting layer UL) forming the SQUID inductors 4a,4b are out of alignment, and accordingly, it is considered that if the component perpendicular to the superconducting thin film forming the SQUID inductors 4a,4b is 16 μT or less, magnetic flux trapping does not readily occur.

When cooling (use) in the external magnetic field B with a greater intensity is demanded, it is considered effective to make the line width of the SQUID inductors 4a,4b thinner. For example, when the line width is half, 2.5 μm, a highly-sensitive magnetic measurement is possible without generating magnetic flux trapping even in the cooling (use) in the external magnetic field B of about 120 μT. Thus, it is for the reason of no necessity to form the input coils 5a,5b on the SQUID inductors 4a,4b that the width of the SQUID inductors 4a,4b can be made thin.

(Third embodiment)

Figure 6A:
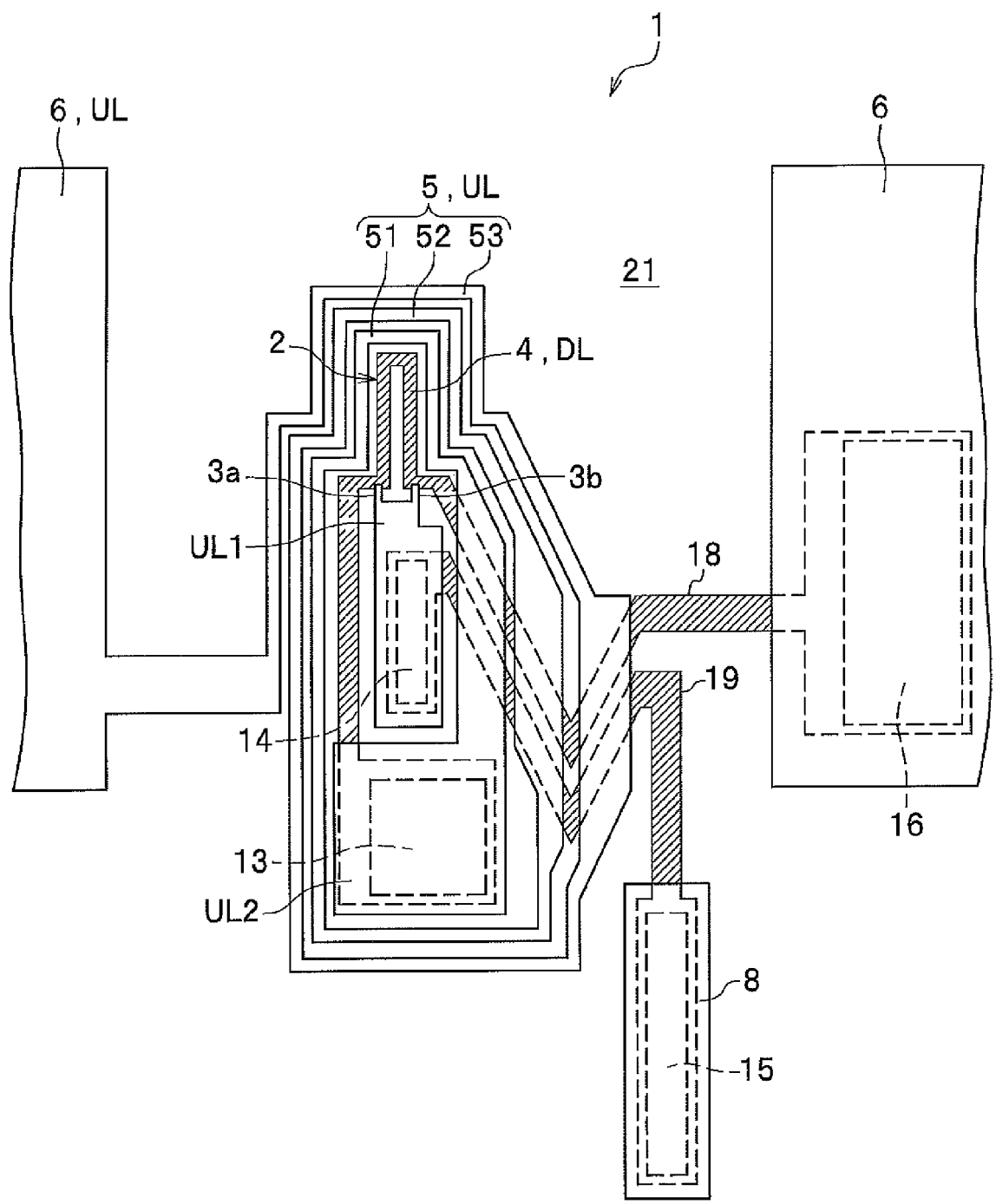
FIG. 6A is an enlarged view of the circumference of the SQUID 2 in a high-temperature superconducting magnetic sensor according to a third embodiment of the present invention.

FIG. 6A illustrates an enlarged view of the circumference of the SQUID 2 in a high-temperature superconducting magnetic sensor 1 according to a third embodiment of the present invention. The high-temperature superconducting magnetic sensor 1 of the third embodiment differs from the high-temperature superconducting magnetic sensor 1 of the first embodiment in that the SQUID inductor 4 is formed on the lower part superconducting layer DL and the input coil 5 is formed on the upper part superconducting layer UL. With this difference, the upper part superconducting region UL1 is connected to the SQUID inductor 4 in the Josephson junctions 3a,3b. Moreover, the upper part superconducting region UL1 is connected to the electrode 8 via the superconducting contact (region) 14, a wiring 19 formed on the lower part superconducting layer DL, and a superconducting contact (region) 15. The wiring 19 passes under the input coil 5 and is connected to the electrode 8 outside the input coil 5. Moreover, a connection part between one end of the SQUID inductor 4 and the Josephson junction 3a is connected via the superconducting contact (region) 13 to the input coil 5(51). A connection part between one end (another end) of the SQUID inductor 4 and the Josephson junction 3b is connected via a wiring 18 and a superconducting contact (region) 16 to one end of the pickup coil 6. The wiring 18 passes under the input coil 5 and is connected to the pickup coil 6 outside the input coil 5. One end (another end) of the pickup coil 6 is connected to the input coil 5(53). The number of manufacturing steps and the manufacturing process are the same as the example in the second embodiment. The line width of the superconductor constituting the SQUID inductor 4, the size of the pickup coil and the like are also the same shapes as the example in the second embodiment.

The winding of the input coil 5 (51,52,53) and the wirings 18,19 intersect one another at an angle deviated from a right angle. Moreover, the line width of the input coil 5 (51,52,53) becomes larger in the intersecting portion than in the other portion. These make it possible to ease the slope with which the input coil 5 (51,52,53) steps over the wirings 18,19 and to realize a reliable conduction. Moreover, it is possible to suppress manufacturing defects such as disconnection.

Meanwhile, the effective area $A_{eff}$ of the SQUID 2 was 0.45 mm$^2$. This value was approximately the same as that in the case of the number of turns of the input coils 5a,5b being 3 turns in the second embodiment. Moreover, the line width of the superconductor constituting the SQUID inductor 4 was 5 μm, and magnetic flux trapping did not occur even when cooling in the magnetic field B of 60 μT.

(Fourth embodiment)

Figure 6B:
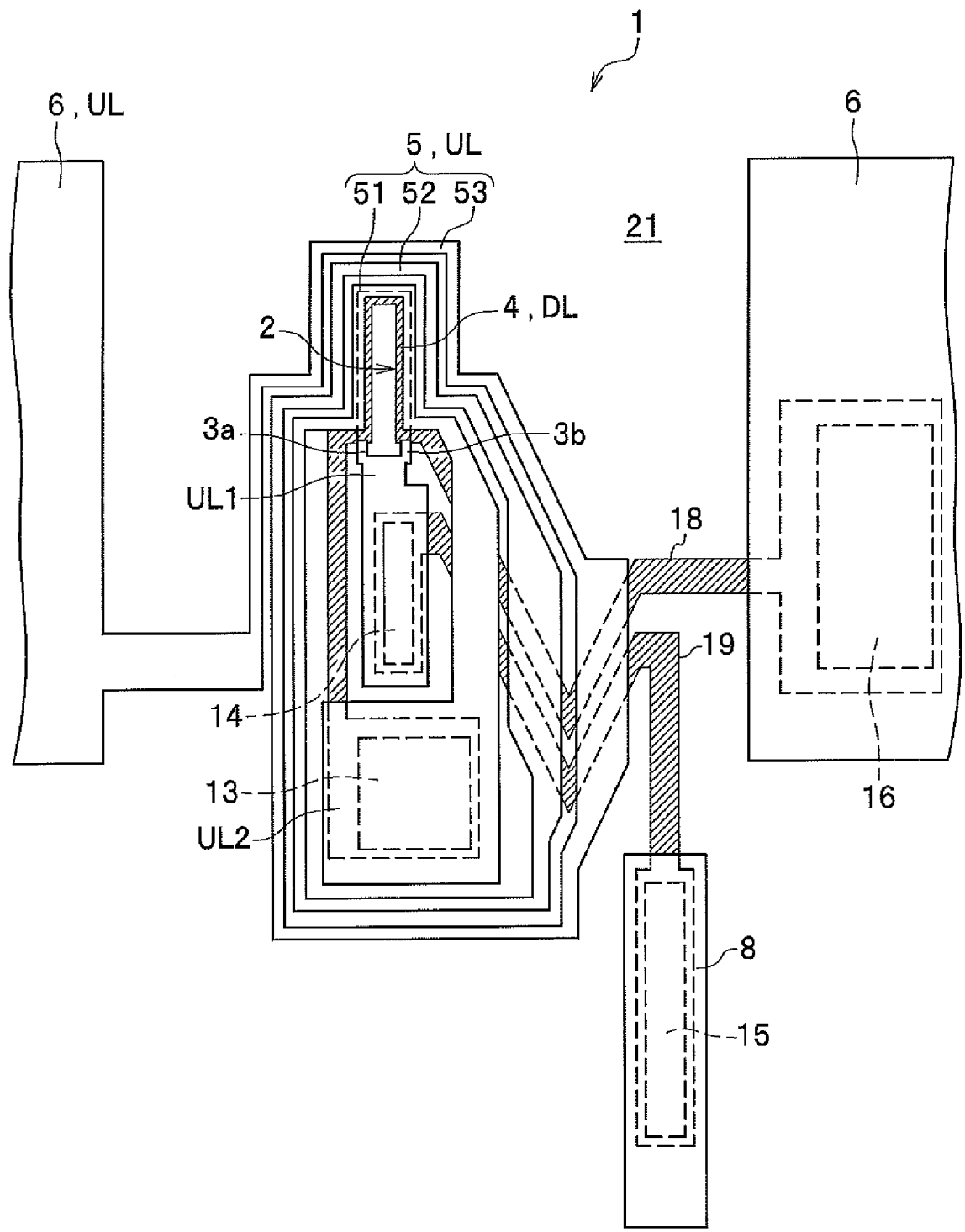
FIG. 6B is an enlarged view of the circumference of the SQUID 2 in a high-temperature superconducting magnetic sensor according to a fourth embodiment of the present invention.

FIG. 6B illustrates an enlarged view of the circumference of the SQUID 2 in a high-temperature superconducting magnetic sensor 1 according to a fourth embodiment of the present invention. The high-temperature superconducting magnetic sensor 1 of the fourth embodiment differs from the high-temperature superconducting magnetic sensor 1 of the third embodiment in that the innermost circumferential turn 51 of the input coil 5 is arranged to overlap the SQUID inductor 4, in planar view. The innermost circumferential turn 51 of the input coil 5 and the SQUID inductor 4 are formed on the superconducting layers different from each other, the lower part superconducting layer DL and the upper part superconducting layer UL, and are stacked with the insulation layer 22 (see FIGS. 3B to 3D) interposed therebetween. Meanwhile, the effective area $A_{eff}$ of the SQUID 2 was 0.55 mm$^2$. This value increased more than 0.45 mm$^2$ in the third embodiment. This is considered to be due to that since the innermost circumferential turn 51 of the input coil 5 overlaps the SQUID inductor 4, the magnetic coupling (coupling coefficient k) between the input coil 5 and the SQUID inductor 4 increased. Moreover, since the innermost circumferential turn 51 of the input coil 5 overlaps the SQUID inductor 4, it is possible to make the size of the input coil 52,53 (5) small and to reduce the distance between the input coil 52,53 and the SQUID inductor 4. Therefore, it is considered to be due to that the magnetic coupling (coupling coefficient k) between the input coil 52,53 (5) and the SQUID inductor 4 also increased.

Moreover, the line width of the SQUID inductor 4 was 5 μm, and magnetic flux trapping did not occur even when cooling in the magnetic field of 60 μT. Furthermore, generation of LC resonance such as reported with respect to a Ketchen-type SQUID was not found. It is considered that although a large capacitive component is generated between the overlapped input coil 51 and the SQUID inductor 4, LC resonance was not generated because the capacitive component to be generated is small compared with the Ketchen-type SQUID in which all of the input coils of a multi-turn structure are stacked on the SQUID inductor.

(Fifth embodiment)

Figure 7:
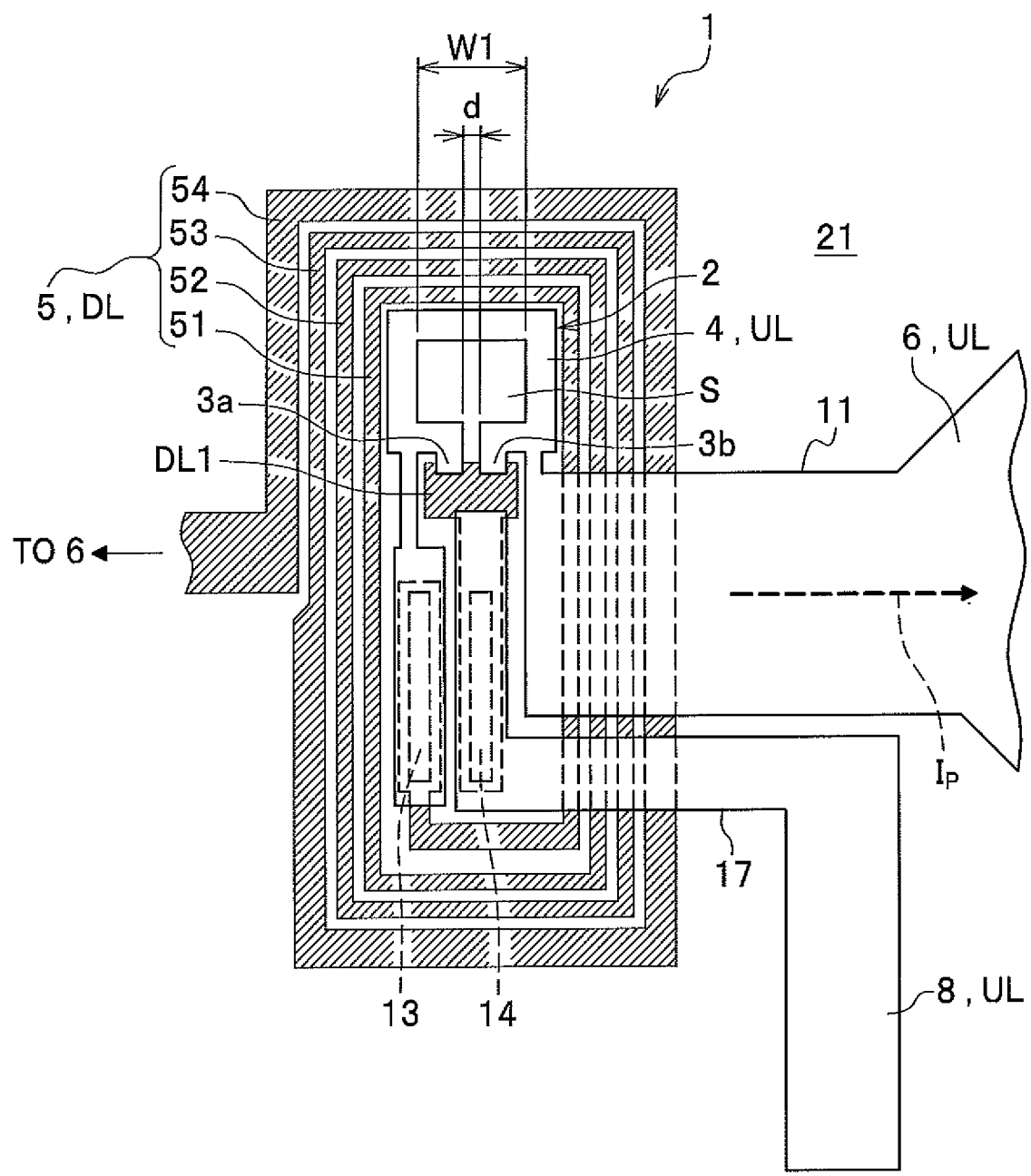
FIG. 7 is an enlarged view of the circumference of the SQUID 2 in a high-temperature superconducting magnetic sensor according to a fifth embodiment of the present invention.

FIG. 7 illustrates an enlarged view of the circumference of the SQUID 2 in a high-temperature superconducting magnetic sensor 1 according to a fifth embodiment of the present invention. The high-temperature superconducting magnetic sensor 1 of the fifth embodiment differs from the high-temperature superconducting magnetic sensor 1 of the first embodiment in that the width W1 of the magnetic flux trapping area S of the SQUID 2 in the array direction in which a pair of Josephson junctions 3a,3b are arrayed is greater than the distance d between the pair of Josephson junctions 3a,3b (W1>d). With this, the magnetic flux trapping area of the SQUID 2 has a square shape, not of a slit hole type which is used in a directly-coupled type SQUID.

In the present invention, the shielding current $I_p$ which flows through the pickup coil 6 is coupled with the SQUID inductor 4 by both of the direct coupling (current coupling) and the magnetic coupling. The coupling efficiency of the direct coupling is proportional to the inductance $L_s$ of the SQUID inductor 4. On the other hand, the magnetic coupling (coupling coefficient k) between the input coil 5 and the SQUID inductor 4 depends on the area of the magnetic flux trapping area S of the SQUID inductor 4. Even for the SQUID inductor 4 of the same inductance $L_s$, the greater the area surrounded by the SQUID inductor 4 (the area of the magnetic flux trapping area S) becomes, the more the magnetic coupling (coupling coefficient k) increases. Note that, even if the area of the magnetic flux trapping area S of the SQUID inductor 4 is increased, magnetic flux trapping does not occur because the line width of the SQUID inductor 4 is thin. Also, the shape of the magnetic flux trapping area S of the SQUID inductor 4 is not limited to the square and may be a circle, an octagon and the like, which have an effect of increasing the magnetic flux trapping area S of the SQUID inductor 4 in the same manner. Moreover, the number of turns of the input coil 5(51,52,53,54) is increased to 4 turns. This makes it possible to increase the magnetic coupling (coupling coefficient k). Moreover, in the same manner as in the third and fourth embodiments, it is also possible to make the SQUID inductor 4 with the lower part superconducting layer DL and to make the input coil 5 with the upper part superconducting layer UL. Moreover, in the same manner as in the fourth embodiment, the innermost circumferential turn 51 may be overlapped with the SQUID inductor 4.

(Sixth embodiment)

Figure 8:
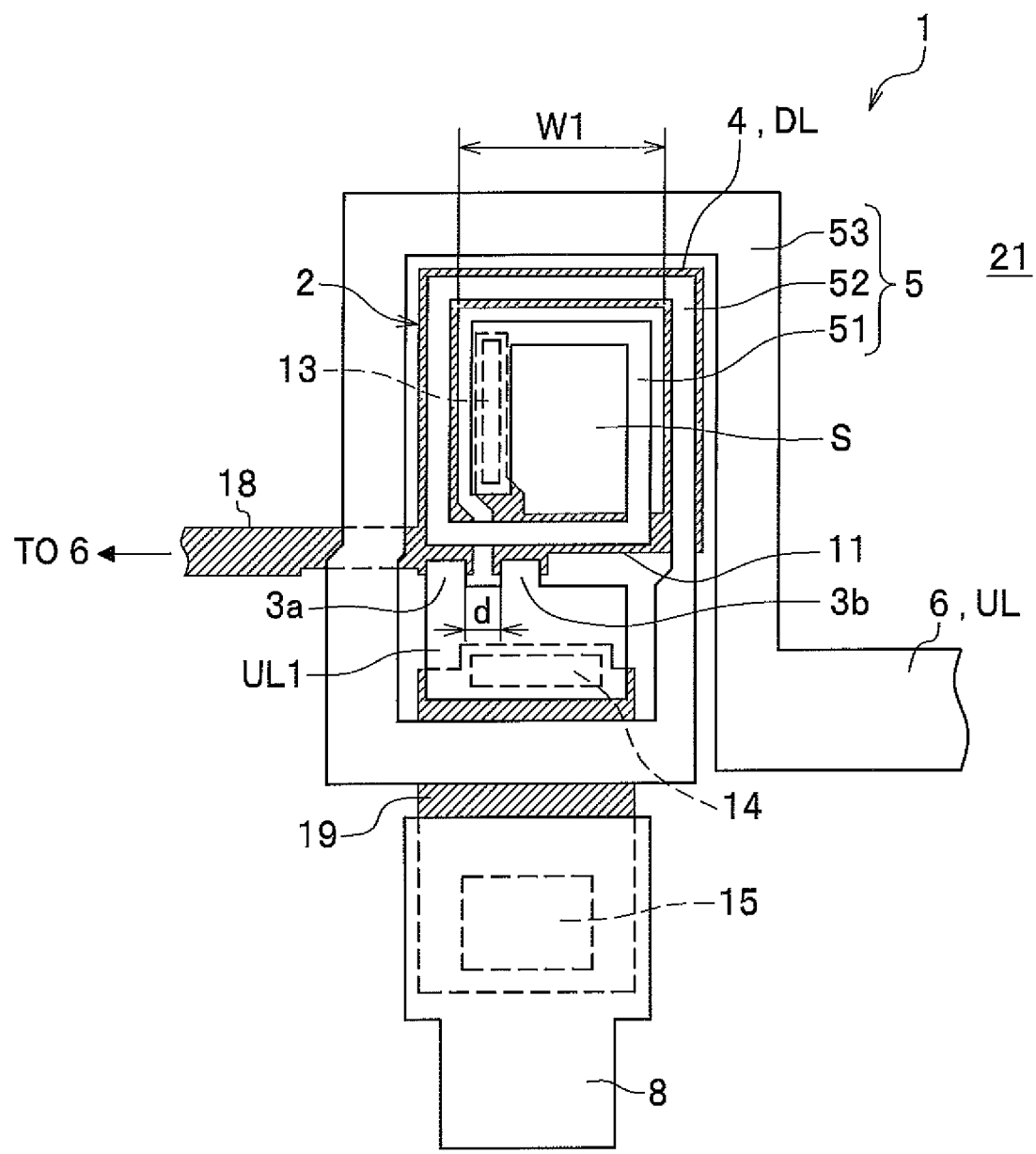
FIG. 8 is an enlarged view of the circumference of the SQUID 2 in a high-temperature superconducting magnetic sensor according to a sixth embodiment of the present invention.

FIG. 8 illustrates an enlarged view of the circumference of the SQUID 2 in a high-temperature superconducting magnetic sensor 1 according to a sixth embodiment of the present invention. The high-temperature superconducting magnetic sensor 1 of the sixth embodiment differs from the high-temperature superconducting magnetic sensor 1 of the third and fourth embodiments in that, in planar view, the innermost circumferential turn 51 of the input coil 5 is arranged to be surrounded by the SQUID inductor 4, and the second turn 52 from the inside of the input coil 5 is arranged to overlap the SQUID inductor 4. The second turn 52 from the inside of the input coil 5 and the SQUID inductor 4 are formed on the superconducting layers different from each other, the lower part superconducting layer DL and the upper part superconducting layer UL, and are stacked with the insulation layer 22 (see FIGS. 3B to 3D) interposed therebetween. In planar view, the innermost circumferential turn 51 of the input coil 5 is arranged inside the SQUID inductor 4 (in the magnetic flux trapping area S). By this configuration, the width W1 of the magnetic flux trapping area S of the SQUID 2 in the array direction in which a pair of Josephson junctions 3a,3b are arrayed becomes greater than the distance d between the pair of Josephson junctions 3a,3b (W1>d). The innermost circumferential turn 51 of the input coil 5 is connected via the superconducting contact (region) 13 to the SQUID inductor 4, and is arranged along the inner circumference of the SQUID inductor 4. The second turn 52 from the inside of the input coil 5 is arranged to trace above the SQUID inductor 4. The third turn 53 from the inside of the input coil 5 is arranged along the outer circumference of the SQUID inductor 4. Moreover, the superconducting contact (region) 13 is arranged inside the input coil 5(52,53) and inside the SQUID 2 (SQUID inductor 4) (in the magnetic flux trapping area S). The magnetic coupling (coupling coefficient k) between the input coil 5(51,52,53) and the SQUID inductor 4 increases as the distance between them becomes shorter. The present sixth embodiment succeeds in arranging the third turn 53 from the inside of the input coil 5 closely to the SQUID inductor 4 by arranging the innermost circumferential turn 51 of the input coil 5 inside the SQUID inductor 4. It is possible to easily reduce the sum of the distance between the input coil 51 and the SQUID inductor 4, the distance between the input coil 52 and the SQUID inductor 4, and the distance between the input coil 53 and the SQUID inductor 4, compared with the third embodiment and the like, and to increase the magnetic coupling (coupling coefficient k) between the input coil 5(51,52, 53) and the SQUID inductor 4.

REFERENCE SIGNS LIST

1 High-temperature superconducting magnetic sensor
2, 2a,2b,2c Superconducting quantum interference device (SQUID)
3a,3b (ramp-edge type) Josephson junction
3c Array direction of Josephson junctions
4, 4a,4b,4c SQUID inductor
5, 5a,5b Input coil
51 Innermost circumferential turn
52 Second turn from the inside
53 Third turn from the inside
54 Fourth turn from the inside
6 Pickup coil
7 Closed loop (Magnetic flux transformer)
8, 8a, 8b, 8c Electrode
9 Electrode
11 Wiring
12, 13, 14, 15, 16 Superconducting contact (region) (Contact hole)
17, 18, 19 Wiring
21 Substrate
21a MgO substrate
21b Orientation control buffer layer
21c Black heat absorbing layer
21d Lower part insulation layer
22 Interlayer insulation layer (Insulation layer)
23 Gold electrode layer
DL Lower part superconducting layer
UL Upper part superconducting layer
d Distance between Josephson junctions
S Magnetic flux trapping area of SQUID
W1 Width of magnetic flux trapping area of SQUID
W2 Line width of SQUID inductor
W3 line width of input coil

The invention claimed is:

1. A high-temperature superconducting magnetic sensor having superconducting layers formed on a substrate, a superconducting quantum interference device (SQUID) being formed on the superconducting layers, the high-temperature superconducting magnetic sensor comprising:
- a pickup coil that is formed on the superconducting layers and connected to an inductor of the SQUID; and
- an input coil that is formed on the superconducting layers, connected to the inductor of the SQUID and the pickup coil to form a closed loop, and magnetically coupled with the inductor of the SQUID, wherein
- at least one turn of the input coil surrounds the inductor of the SQUID, or is surrounded by the inductor of the SQUID, in planar view.

2. The high-temperature superconducting magnetic sensor according to claim 1, wherein
- the input coil has a plurality of turns, and
- some turns of the plurality of turns are arranged to overlap the inductor of the SQUID, in planar view.

3. The high-temperature superconducting magnetic sensor according to claim 1, wherein
- at least some turns of a plurality of turns and the inductor of the SQUID are formed on the superconducting layers different from each other, and
- the superconducting layers different from each other are stacked with an insulation layer interposed therebetween.

4. The high-temperature superconducting magnetic sensor according to claim 1, wherein a line width of the inductor of the SQUID is equal to or less than 10 μm.

5. The high-temperature superconducting magnetic sensor according to claim 1, wherein a width of a flux trapping area of the SQUID in an array direction in which a pair of Josephson junctions included in the SQUID are arrayed is greater than a distance between the pair of Josephson junctions.

6. The high-temperature superconducting magnetic sensor according to claim 1, wherein the number of turns of the input coil is equal to or more than 1 turn, and is equal to or less than 6 turns.

7. The high-temperature superconducting magnetic sensor according to claim 1, further comprising a contact region which connects the superconducting layers different from each other, the contact region being provided, in planar view, inside a winding of the input coil and outside the inductor of the SQUID, and connecting the input coil with the inductor of the SQUID.

* * * * *